US006973370B2

(12) United States Patent
Ito et al.

(10) Patent No.: US 6,973,370 B2
(45) Date of Patent: Dec. 6, 2005

(54) SUBSTRATE PROCESSING APPARATUS AND METHOD FOR ADJUSTING A SUBSTRATE TRANSFER POSITION

(75) Inventors: Kazuhiko Ito, Koshi-machi (JP); Kazutoshi Ishimaru, Koshi-machi (JP); Jun Ookura, Koshi-machi (JP); Michio Kinoshita, Koshi-machi (JP); Yuichi Douki, Koshi-machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/859,340

(22) Filed: Jun. 3, 2004

(65) Prior Publication Data
US 2005/0016818 A1    Jan. 27, 2005

(30) Foreign Application Priority Data
Jun. 3, 2003    (JP)    .............................. 2003-158261

(51) Int. Cl.[7] .............................................. G06F 7/00
(52) U.S. Cl. ...................... 700/218; 414/936; 700/213
(58) Field of Search ............................... 700/213, 214, 700/218; 414/935, 936, 941; 901/46, 47

(56) References Cited

U.S. PATENT DOCUMENTS

| 4,955,780 | A | * | 9/1990 | Shimane et al. | ......... 414/744.2 |
| 6,086,453 | A | * | 7/2000 | Fukuoka et al. | ............... 451/5 |
| 6,135,854 | A | * | 10/2000 | Masumura et al. | ............ 451/6 |
| 6,516,244 | B1 | * | 2/2003 | Yoo et al. | ................... 700/218 |
| 6,591,160 | B2 | * | 7/2003 | Hine et al. | ................... 700/218 |
| 6,591,161 | B2 | * | 7/2003 | Yoo et al. | ................... 700/218 |
| 6,593,045 | B2 | * | 7/2003 | Sato et al. | ..................... 430/30 |
| 6,648,730 | B1 | * | 11/2003 | Chokshi et al. | ................ 451/6 |
| 6,845,292 | B2 | * | 1/2005 | Sha et al. | ................... 700/218 |
| 6,915,183 | B2 | * | 7/2005 | Iida et al. | ................... 700/218 |

* cited by examiner

*Primary Examiner*—Khoi H. Tran
(74) *Attorney, Agent, or Firm*—Oblon, Spivak, McClelland, Maier & Neustadt, P.C.

(57) ABSTRACT

A substrate processing apparatus can align a substrate with a high precision and a high speed by monitoring a mark formed on a surface of the substrate; operating an amount of misalignment between the center of the substrate and a rotation center of a substrate support member; determining a presence of the misalignment and adjusting the substrate such that the center of the substrate coincides with the rotation center of the substrate support member.

20 Claims, 19 Drawing Sheets

SUBSTRATE PROCESSING APPARATUS AND METHOD FOR ADJUSTING A SUBSTRATE TRANSFER POSITION

FIELD OF THE INVENTION

The present invention relates to a substrate processing apparatus and a method for adjusting a substrate transfer position; and more particularly, to a substrate processing apparatus for obtaining a position data of a substrate transfer mechanism in advance, when transferring a substrate into a processing unit for performing a predetermined process, e.g., a resist coating process, a developing process and a heating process, on the substrate mounted on a substrate support member, and a method for adjusting a substrate transfer position by using same.

BACKGROUND OF THE INVENTION

Conventionally, a photo resist process, which is conducted in the course of manufacturing a semiconductor device, involves a series of steps of coating a resist on a surface of, e.g., a semiconductor wafer (hereinafter referred to as a wafer) in a form of a thin film; exposing the resist into a predetermined pattern; and then performing a development thereof to thereby obtain a certain mask pattern. In general, such processes are conducted by using a substrate processing apparatus incorporating a coating/developing apparatus for performing coating and developing of the resist; and an exposure apparatus connected thereto.

In order to reduce footprint of the substrate processing apparatus while increasing a throughput thereof, the substrate processing apparatus for performing a plurality of different processes, e.g., a coating process, a developing process, a heating/cooling process, and so forth, on a substrate are unitized. For each process, a required number of units are incorporated and provided, and a substrate transfer mechanism for loading/unloading the substrate into/from each processing unit is also provided therefor.

A coating/developing apparatus shown in FIG. 15 is an example of such substrate processing apparatus. A substrate carrier 10 accommodating therein, e.g., 25 sheets of wafer W, is loaded into a carrier stage 11 and the wafers W are taken out of the carrier 10 by a transfer arm 12 to be loaded into a processing region 14 via a receiving/fetching member of a rack unit 13a. Installed at a central portion of the processing region 14 is a transfer mechanism 15, wherein disposed around the transfer mechanism 15 are a coating unit 16 for coating a wafer W with a coating solution; and, e.g., three rack units 13a, 13b and 13c including a low-temperature heating unit for drying the coating solution, a bake unit for performing a bake process and a cure unit for performing a cure process. The wafer W is loaded into each unit by the transfer mechanism 15.

In order to allow the processing unit to perform a highly precise process on a substrate, a wafer W needs to be mounted on a predetermined mounting region of a processing unit with high precision. Specifically, in the coating unit 16, a coating solution is coated on a surface of the wafer W and, then, a rinse process for rinsing an edge of the wafer W is executed by supplying a rinsing solution on the edge of the wafer W through a cleaning solution nozzle while rotating the wafer W about a vertical axis. Therefore, if a center of the wafer W is deviated from a center of the rotation axis, a phenomenon in which a certain portion of the edge is not cleaned while other portion is cleaned by more than a predetermined width occurs. Further, in a heating/cooling unit, such a deviation of the center of the wafer W from the center of the rotation axis may cause non-uniformity in in-surface temperature of the wafer W. Accordingly, before the process is initiated, a transfer position of the wafer W is previously programmed in the transfer mechanism 15 so as to allow the wafer W to be mounted on an appropriate mounting region. Such process is referred to as teaching, in general. A conventional teaching method involves determining whether the wafer W is mounted on a predetermined mounting region by way of detecting the edge of the wafer W placed on a mounting region through the use of, e.g., a reflective type sensor; and then adjusting the transfer position based on thus determined result (see, for example, paragraphs 0069 to 0072 and FIG. 9 of Japanese Patent Laid-open Application No. 2000-349133). Herein, an example of such conventional teaching method will be explained with respect to the coating unit 16 by referring to FIG. 16. A reference numeral 2 represents a spinner capable of rotating a wafer W about a vertical axis while supporting the wafer W from its backside. Further, a reference numeral 21 is a reflective type sensor capable of moving back and forth in a radial direction of the wafer W by a driver unit (not shown).

The teaching is carried out as follows. First, the wafer W is transferred onto the spinner 2 by the transfer mechanism 15, and the sensor 21 on standby outside of a peripheral portion of the wafer W is moved in a horizontal direction at a predetermined velocity such that it passes through the space above the peripheral portion of the wafer W. Subsequently, the sensor 21 is returned to a position right in front of the position where the light is reflected last, and is retracted slowly at an interval of, e.g., one pulse, for improved precision thereof, thereby detecting the peripheral portion of the wafer W. Thereafter, the wafer W is rotated three times about the vertical axis at an angular interval of 90 degrees, and the same detecting process as described above is performed for each rotation. Then, based on thus obtained position data of four points on the peripheral portion of the wafer W, the center position of the wafer W is calculated by performing an operation. Then, adjusting the wafer W (i.e., re-execution) is repeatedly performed until the center of the wafer W coincides with the center of the rotation axis of the spinner, which is detected in advance, or until the deviation value therebetween comes into a tolerance range. As the re-execution is conducted, the misalignment becomes reduced. In most cases, the wafer W can be successively aligned on the spinner within five-times of re-executions.

In the conventional teaching method, however, a single sensor 21 is employed due to economic constraints and because installing a sensor 21 in every unit of the substrate processing apparatus is not cost-effective. However, such setup necessitates an operator to set up the sensor 21 for every processing unit subject to teaching. However, in case of the coating/developing apparatus including a plurality of processing units, having reduced sizes for the purpose of reducing the footprint of the apparatus, it takes great amount of time for the operator to set up the sensor 21 in each unit while performing the axis alignment.

Moreover, when using the photo-reflective sensor 21, a sensor capability thereof may vary depending on the ambient, e.g., dusts and the degree of illumination may hinder detection of the edge of the wafer W with high precision.

SUMMARY OF THE INVENTION

It is, therefore, an object of the present invention to provide a substrate processing apparatus capable of aligning a substrate with a high precision and a high speed; and a method for aligning a position of the substrate.

In accordance with one aspect of the invention, there is provided a substrate processing apparatus having a processing unit for processing a substrate horizontally supported on a substrate support member rotatable about a vertical axis, wherein the apparatus has preacquired data of a substrate transfer position of a substrate transfer mechanism with respect to the substrate support member, the apparatus including: a camera unit for photographing a mark formed on a surface of a position aligning substrate, placed on the substrate support member by the substrate transfer mechanism; an operation unit for calculating an amount of misalignment between a center of the position aligning substrate and a center of rotation of the substrate support member by using position data of a center of locations of the mark photographed before and after rotating the substrate support member by an angle of 180 degrees, respectively; a determination unit for judging whether or not the position aligning substrate is aligned with the substrate support member from the amount of misalignment; a adjusting unit for repositioning the position aligning substrate by the substrate transfer mechanism to allow the center of the position aligning substrate to coincide with the center of rotation of the substrate support member if it is judged that the position aligning substrate is not aligned with the substrate support member; and a storage unit for storing position data of the substrate transfer mechanism when it is determined that the position aligning substrate is aligned with the center of the substrate support member.

In accordance with another aspect of the invention, there is provided a substrate processing apparatus having a processing unit for processing a substrate horizontally supported on a substrate support member, wherein the apparatus has preacquired data of a substrate transfer position of a substrate transfer mechanism with respect to the substrate support member, the apparatus including: a camera unit for photographing a mark formed at a center of a surface of a position aligning substrate placed on the substrate support member by the substrate transfer mechanism; and a determination unit for judging whether or not a center of the position aligning substrate coincides with a center of the substrate support member by using a photographed result of the mark obtained by the camera unit and a photographed result of a mark formed at the center of the substrate support member.

In accordance with still another aspect of the invention, there is provided a substrate processing apparatus having a processing unit for processing a substrate horizontally supported on a substrate support member, wherein the apparatus has preacquire data of a substrate transfer position of a substrate transfer mechanism with respect to the substrate support member, the apparatus including: a camera unit for photographing a mark formed at a center of a surface of a position aligning substrate placed on the substrate support member by the substrate transfer mechanism; an operation unit for calculating an amount of misalignment between a center of the position aligning substrate and a center of the substrate support member by using a photographed result of the mark obtained by the camera unit and a photographed result of a mark formed at the center of the substrate support member monitored in advance; a determination unit for judging whether or not the amount of misalignment is greater than a threshold value; a adjusting unit for repositioning the position aligning substrate by the substrate transfer mechanism to allow the center of the position aligning substrate to coincide with the center of the substrate support member when it is determined that the amount of misalignment is greater than the threshold value; and a storage unit for storing position data of the substrate transfer mechanism when the amount of misalignment is not greater than the threshold value.

In accordance with still another aspect of the invention, there is provided a substrate processing apparatus having a processing unit for processing a substrate horizontally supported on a substrate support member rotatable about a vertical axis, wherein the apparatus has preacquired data of a substrate transfer position of a substrate transfer mechanism with respect to the substrate support member, the apparatus including: a first transfer arm for placing a position aligning substrate on the substrate support member; a camera unit for photographing a mark formed on a surface of the position aligning substrate placed on the substrate support member and a marking serving as a center position of the substrate support member; a second transfer arm for supporting the camera unit, the first and the second transfer arm being different from each other; a position data acquisition program for obtaining mark position coordinate data from a photographed result of the mark obtained by the camera unit before and after rotating the position aligning substrate by 180 degrees placed on the substrate support member and marking position coordinate data from a photographed result of the marking by the unit; an operation unit for calculating an amount of misalignment by comparing the marking position coordinate data with center position coordinate data corresponding to a center of locations represented by the mark position coordinate data; a determination program for judging whether or not the position alignment substrate is aligned with the substrate support member by using the amount of misalignment; a re-execution program for repositioning the position aligning substrate by the first transfer arm to allow a center of the position aligning substrate to coincide with the center position of the substrate support member; a storage unit for storing position data of the first transfer arm when it is determined that the position aligning substrate is aligned with the substrate support member.

In accordance with still another aspect of the invention, there is provided a substrate transfer position adjusting method for acquiring position data of a substrate transfer mechanism in transferring a substrate on a substrate support member rotatable about a vertical axis and installed to a processing unit for processing a substrate, including the steps of: (a) transferring a position aligning substrate having a mark formed at a surface thereof on the substrate support member by the substrate transfer mechanism; (b) photographing the mark by a camera unit before and after rotating the substrate support member by an angle of 180 degrees; (c) calculating an amount of misalignment between a center of the substrate and a center of rotation of the substrate support member based on position data of a middle point of a straight line connecting positions of each mark obtained in the step of (b); (d) judging whether or not the position aligning substrate is aligned with the substrate support member from the amount of misalignment; (e) repositioning the position aligning substrate by the substrate transfer mechanism to allow the center of the position aligning substrate to coincide with the center of rotation of the substrate support member if it is judged that the position aligning substrate is not aligned with the substrate support member; and (f) acquiring position data of the substrate transfer mechanism when it is determined that the position aligning substrate is aligned with the substrate support member.

In accordance with still another aspect of the invention, there is provided a substrate transfer position adjusting method for acquiring position data of a substrate transfer mechanism in transferring a substrate on a substrate support member installed to a processing unit for processing a substrate, including the steps of: (a) transferring a position aligning substrate having a mark formed at a center of a surface thereof on the substrate support member by the substrate transfer mechanism; (b) photographing the mark by a camera unit; and (c) judging whether or not the position aligning substrate is aligned with the substrate support member from a result of the photographing obtained in the step of (b).

In accordance with still another aspect of the invention, there is provided a substrate transfer position adjusting method for acquiring position data of a substrate transfer mechanism in transferring a substrate on a substrate support member installed to a processing unit for processing a substrate, including the steps of: (a) transferring a position aligning substrate having a mark formed at a center of a surface thereof on the substrate support member by the substrate transfer mechanism; (b) photographing the mark by a camera unit; (c) calculating an amount of misalignment between the center of the substrate and a center of rotation of the substrate support member based on a result of the photographing obtained in the step of (b); (d) judging whether or not the amount of misalignment is greater than a threshold value; (e) repositioning the position aligning substrate by the substrate transfer mechanism to allow the center of the position aligning substrate to coincide with the center of the center of the substrate support member when it is determined that the amount of misalignment is greater than the threshold value; and (f) acquiring position data of the substrate transfer mechanism obtained when it is determined that the position aligning substrate is aligned with the center of the substrate support member.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
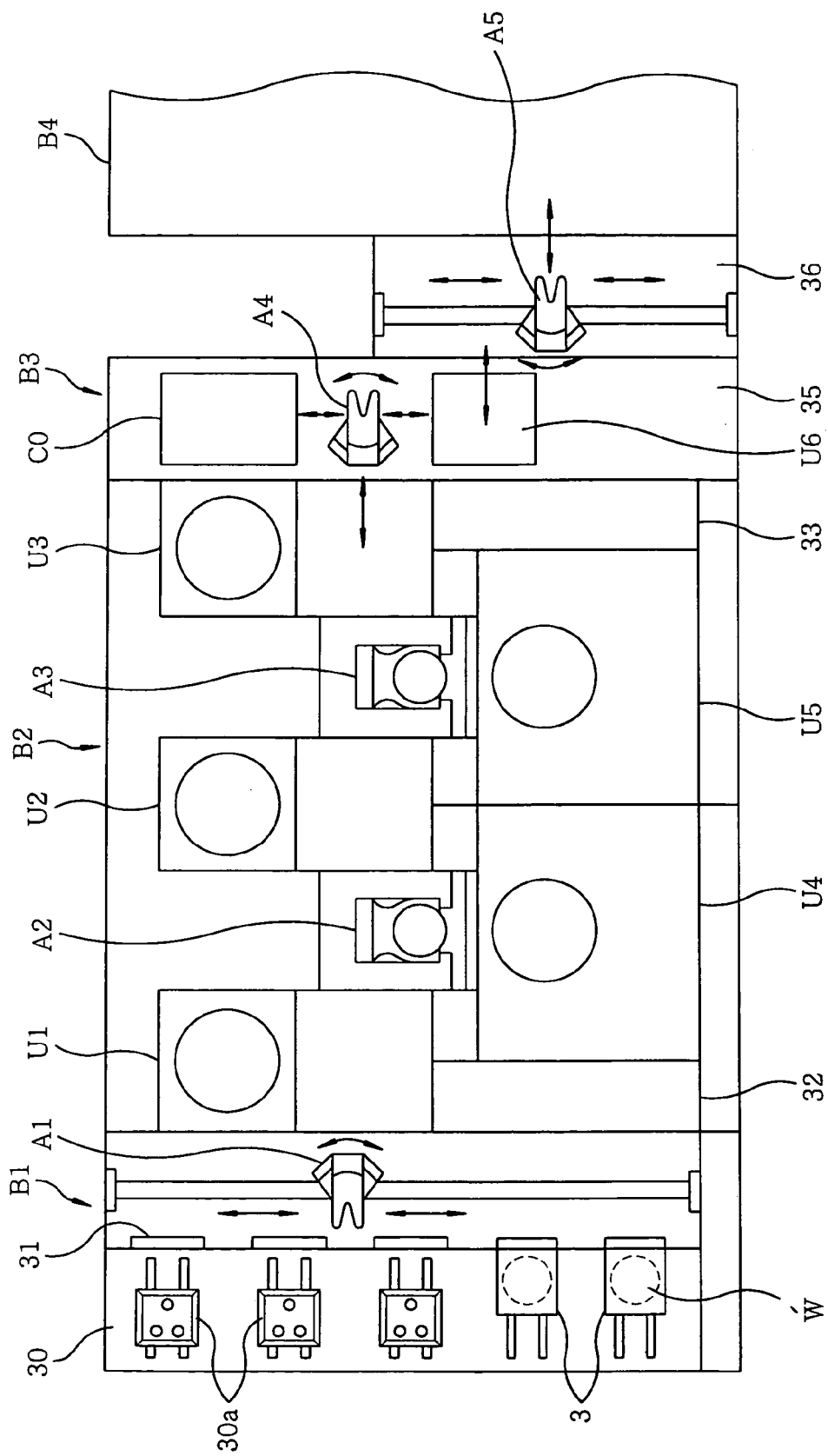
FIG. 1 is a plan view of a coating/developing apparatus in accordance with a preferred embodiment of the present invention.
Figure 2:
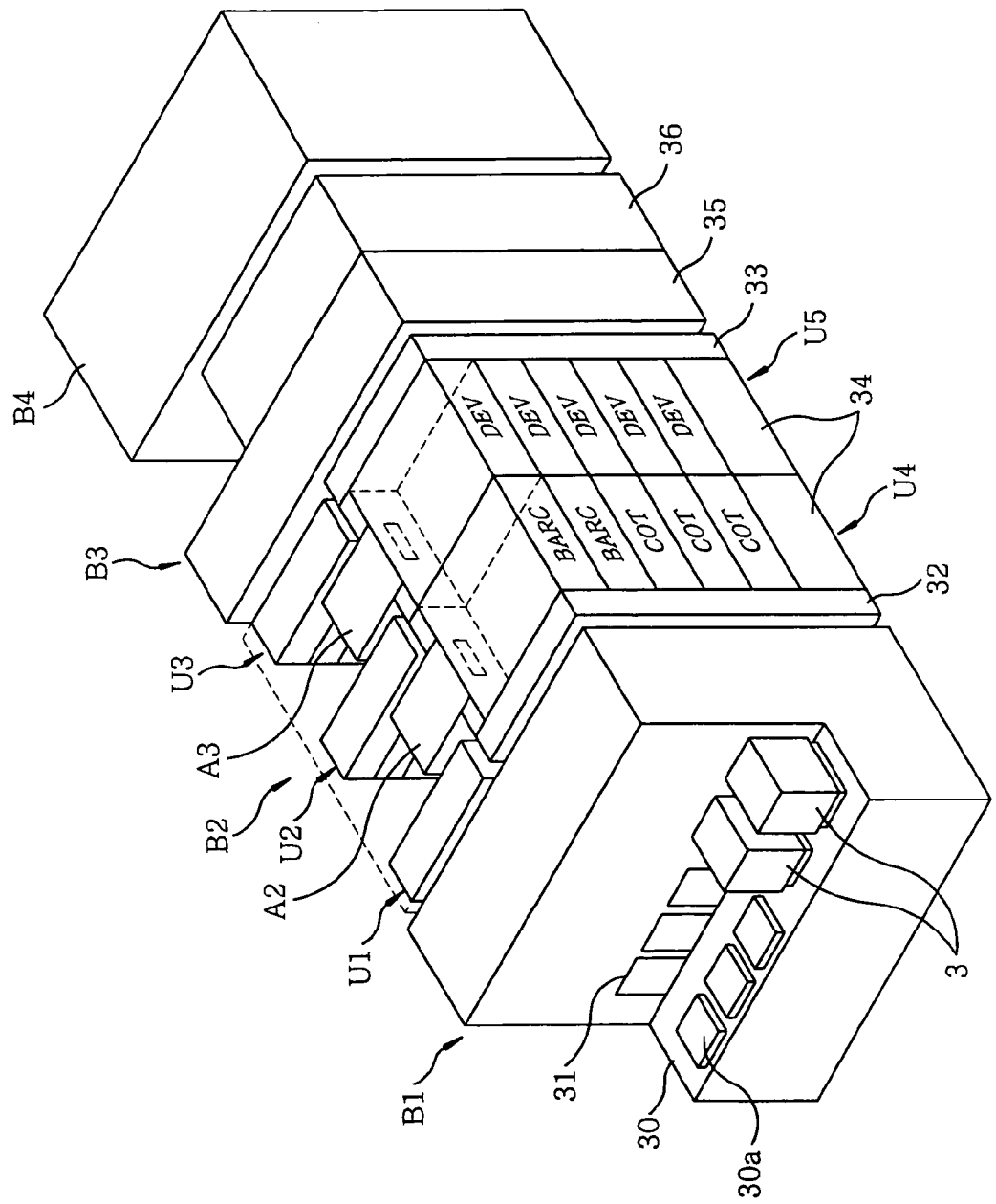
FIG. 2 provides a perspective view of the coating/developing apparatus in accordance with the preferred embodiment of the present invention.

First, a coating/developing apparatus incorporated in a substrate processing apparatus in accordance with a preferred embodiment of the present invention will be described hereinafter with reference to FIGS. 1 and 2.

A reference numeral B1 represents a cassette mount block for loading and unloading cassettes 3 each hermetically accommodating therein, e.g., 13 sheets of wafer W as a substrate. The cassette mount block B1 includes a cassette station 30 having amounting stage 30a for mounting a number of cassettes 3 thereon; opening/closing members 31 installed at a front wall, when viewed from the cassette station 30; and a conveying mechanism A1 for taking out wafers W from the cassettes 3 through the opening/closing members 31. Further, connected to the rear side of the cassette mount block B1 is a processing block B2 including three rack units U1, U2 and U3 each having a stack of heating or cooling system units; liquid processing units U4 and U5 for performing predetermined liquid processes on the wafers W by using processing solutions; and main transfer mechanisms A2 and A3 for loading the wafers W into each unit. That is, the main transfer mechanisms A2 and A3 are configured to be accessible to each of the neighboring units, and the wafers W can be freely carried throughout the processing block B2 from the rack unit U1 at one of the ends thereof to the rack unit U3 at the other end thereof. Further, reference numerals 32 and 33 represent temperature/humidity control units each including a duct for controlling temperature/humidity or a device for controlling a temperature of the processing solution employed by each unit.

Each of the liquid processing units U4 and U5 is configured to have a stack of, e.g., five processing units made up of a combination of a coating unit COT, a developing unit DEV and a bottom antireflection coating unit BARC piled on a receiving area 34 serving as a space for supplying liquid chemical such as coating solution (resist solution) or developing solution. Further, each of the rack units U1, U2 and U3 described above is configured to have a stack of, e.g., 10 units, in combination for performing pre- and post-precesses of the processes executed by the liquid processing units U4 and U5. Specifically, the combination includes a heating unit for heating (baking) the wafers W, a cooling unit for cooling the wafers W, and so forth.

An exposure block B4 is connected to a rear side of the rack unit U3 of the processing block B2 via an interface block B3 made up of a first and a second transfer chamber 35 and 36. The interface block B3 incorporates a rack unit U6 and a buffer cassette C0 in addition to the two conveying mechanisms A4 and A5 for performing the transfer of the wafer W.

Flow of a wafer W in such coating/developing apparatus will be explained briefly. First, if a cassette 3 containing therein wafer W is carried into a mounting stage 30a from outside, a cover of the cassette 3 is separated while an opening/closing member 31 is opened, and a wafer W is extracted from the cassette 3 by the conveying mechanism A1. Then, the wafer W is transferred to the main transfer mechanism A2 via a receiving/fetching unit (not shown) forming a first component of the rack unit U1. In the rack unit U4, e.g., a bottom antireflection coating forming process is performed, and in one of the rack units U1 to U3, a heating and cooling process as pre-preparation for a following coating process is performed and, thereafter, the wafer W is coated with resist solution by a coating unit COT. Subsequently, the wafer is heated (baked) by a heating unit in one of the rack units U1 to U3, and is loaded into the interface block B3 via a receiving/fetching unit of the rack unit U3 after being cooled down. The wafer W is transferred from the interface block B3 into the exposure block B4 through the path of, e.g., the conveying mechanism A4→the rack unit U6→the conveying mechanism A5, and an exposure process is performed. Upon completion of the exposure process, the wafer W is delivered back to the processing block B2 in a reverse path and is developed by a developing unit DEV, thereby obtaining a resist mask formed thereon. Thereafter, the wafer W is returned into the cassette 3 of the mounting stage 30a.

Figure 3:
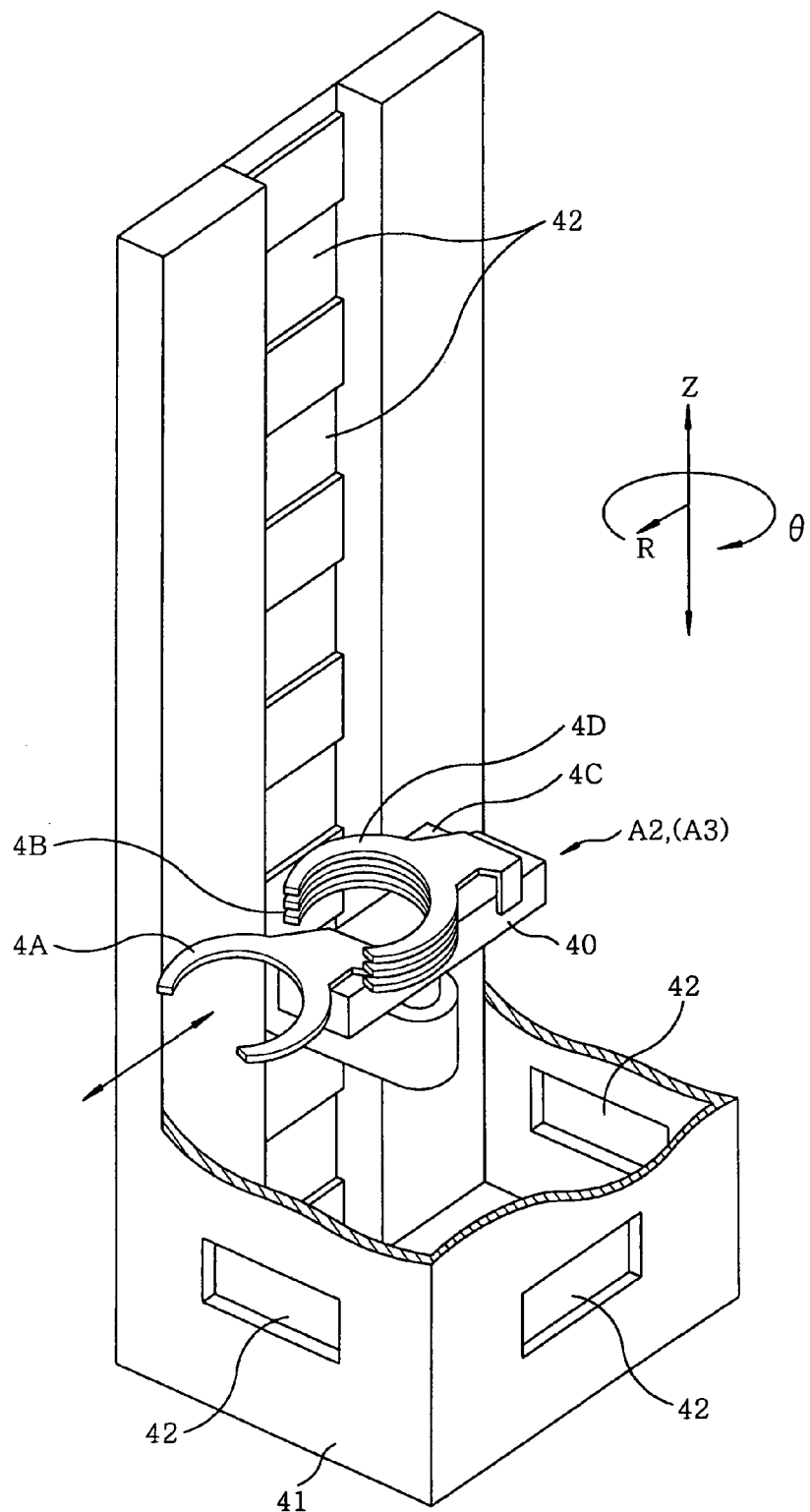
FIG. 3 shows a perspective view of a substrate transfer mechanism employed in the coating/developing apparatus.

Hereinafter, configuration of the main transfer mechanism A2 (A3) serving as a substrate transfer mechanism will be described in detail with reference to FIG. 3. The main transfer mechanism A2 (A3) includes a moving platform 40 capable of being vertically moved and rotated about a vertical axis by a driver unit (not shown). Vertically disposed at the moving platform 40 are, e.g., three transfer arms 4A to 4C for horizontally transferring a wafer W while supporting a peripheral portion thereof from a backside; and a transfer arm 4D for use in teaching process (hereinafter referred to as a teaching transfer arm), and, at the same time, each of the transfer arm 4A (4B, 4D) can independently move back and forth by the driving mechanism. Further, since the transfer arm 4D is used only upon a teaching process to be described later, it is separated from the moving platform 40 when all teachings are completed. Moreover, the main transfer mechanism A2 (A3) is surrounded by a partition wall 41 for partitioning a processing space. Loading/unloading of the wafer W into/from a processing unit of each component is conducted through transfer openings 42 formed at an upper and a lower portion of the sidewall of the partition wall 41. That is, a horizontal position of the main transfer mechanism A2 (A3) is determined by a distance R of which the transfer arm 4A (4B, 4C) moves back and forth and rotation angle θ through the use of polar coordinates while a vertical position of the main transfer mechanism A2 (A3) is determined by a vertical direction (Z axis). That is, the position of the transfer arms 4A to 4C is defined by R, θ and Z position coordinates, and the control of the amount of movement thereof can be exercised by controlling the operations of driver units separately installed at each axis by using, e.g., an encoder.

Figure 4:
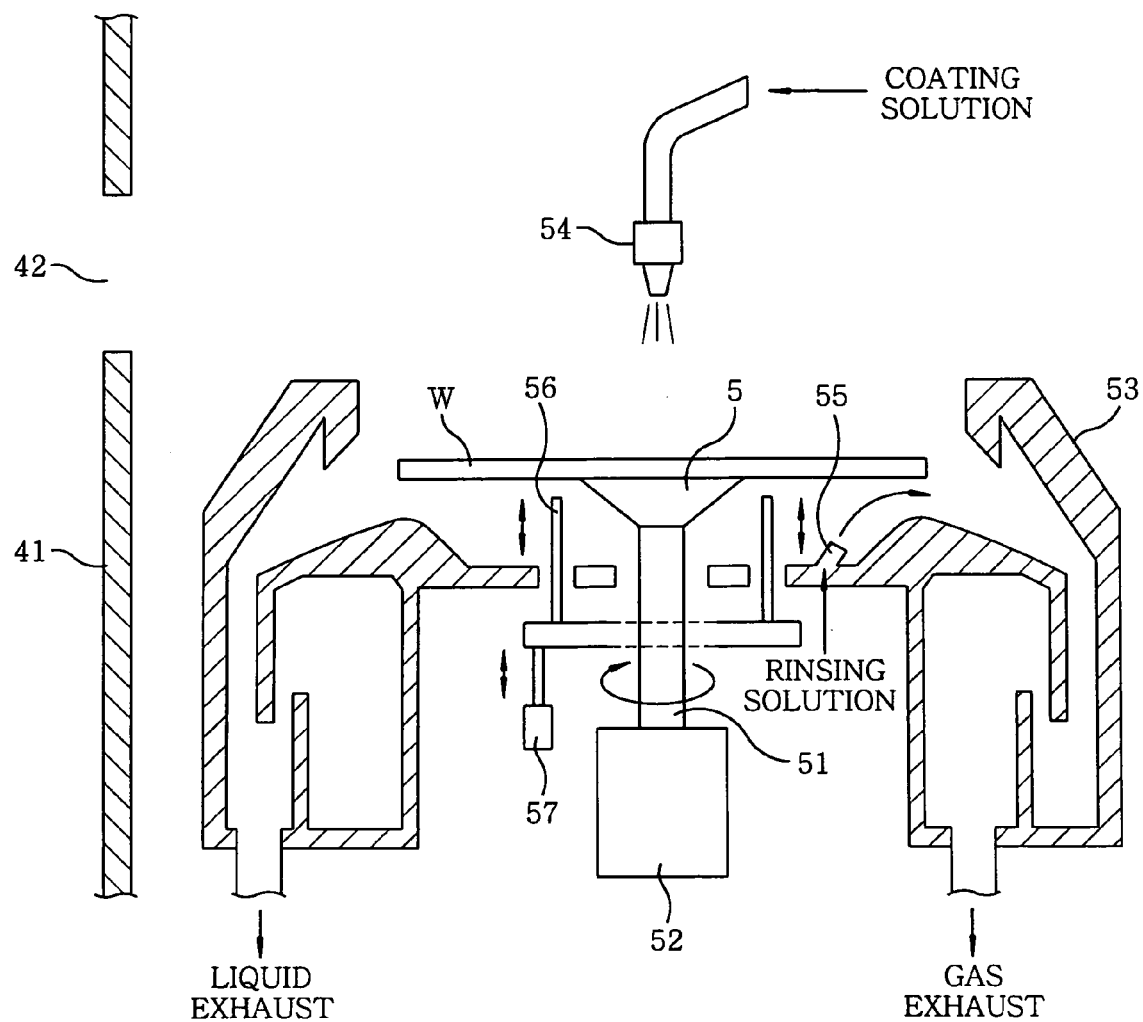
FIG. 4 describes a cross sectional view of a coating unit incorporated in the coating/developing apparatus.

However, as described, the coating/developing apparatus includes a plurality of processing units having different apparatus configurations for carrying out different processes while performing the loading and unloading of the wafer W with respect to each processing unit by using the main transfer mechanism A2 (A3) in common. Accordingly, a specific teaching method adequate for each of the different configurations needs to be chosen for more efficient execution of teaching. For such reason, two different teaching methods are shown in accordance with the preferred embodiment of the present invention: one is designed for the case where a wafer mounting table of a to-be-taught processing unit rotates and the other is for the case where the wafer mounting table dose not rotate. A coating unit COT as a processing unit having a function of rotating a wafer W is shown in FIG. 4 while a heating unit BAKE as an example of a processing unit without a function of rotating is provided in FIG. 5.

The coating unit COT will be first explained in detail. In FIG. 4, a reference numeral 5 is a spin chuck serving as a substrate support member for attracting and holding a backside of wafer W. The spin chuck 5 is connected to a driver unit 52 via a vertical axis 51 and is configured to rotate about the vertical axis while supporting the wafer W horizontally. A cup 53 is installed to surround the vicinity of the edge of the wafer W supported on the spin chuck 5. Further, a coating solution supply nozzle 54 for supplying coating solution, i.e., resist solution is disposed facing the surface of the wafer W. Further, installed below the wafer W is a rinsing solution jetting portion 55 for supporting rinsing solution to the peripheral portion of the wafer W. Provided below the backside of the spin chuck 5 are, e.g., three substrate support pins 56, each serving as a substrate elevating member, which are made to support the wafer W from the backside thereof by being elevated by an elevating mechanism 57.

The transfer arm 4A (4B, 4C) enters into the coating unit COT through the transfer openings 42 on the partition wall 41 while maintaining the wafer W horizontally, and the wafer W is placed at a predetermined transfer position, e.g., a position above a substrate support region of the spin chuck 5. Then, the wafer W is transferred on the surface of the spin chuck 5 in cooperation with the substrate support pins 56 capable of being vertically moved. Thereafter, the transfer arm 4A (4B, 4C) is retracted, and the coating solution supply nozzle 54 supplies resist solution on a central portion of the wafer W and, at the same time, the wafer W is rotated about to the vertical axis, thereby diffusing the resist solution across the surface of the wafer W due to a centrifugal force. Subsequently, the resist solution is spin-dried by rotating the wafer W at a high speed. Then, the rinsing solution is supplied onto the peripheral portion of the wafer W from the rinsing solution jetting portion 55 while rotating the wafer W again, thereby performing an edge rinsing process for washing off the resist solution coated on the peripheral portion of the wafer.

Figure 5:
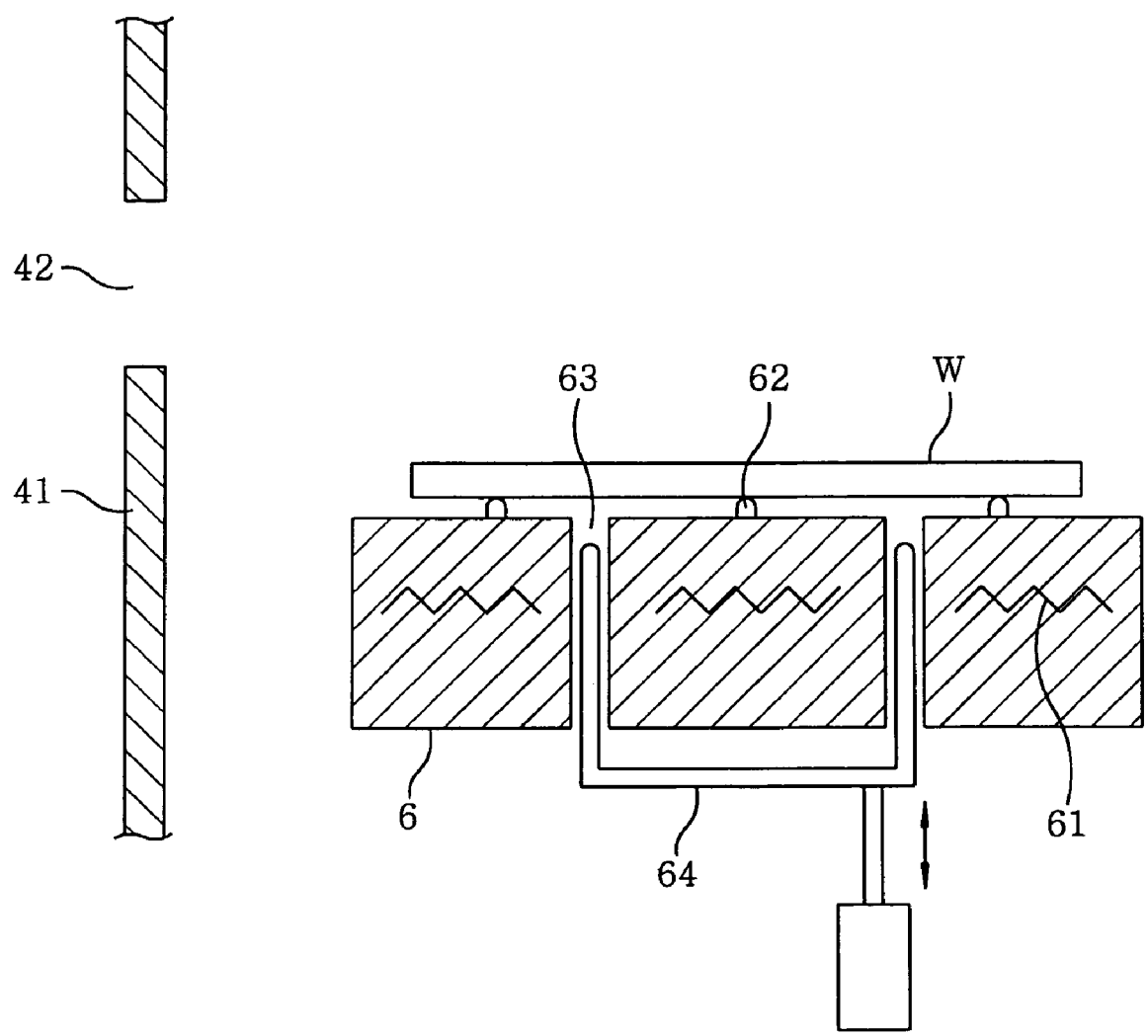
FIG. 5 shows a cross sectional view of a heating unit incorporated in the coating /developing apparatus.

Now, the heating unit BAKE will be described in detail. In FIG. 5, a reference numeral 6 represents a mounting table serving as a substrate support member for mounting thereon a wafer W. Embedded in the mounting table 6 is a heater 61, and the surface of the mounting table 6 constitutes a heating plate for heating the wafer W. Further, provided on the mounting table 6 is a plurality of protrusions 62 referred to as proximity pins for slightly lifting up the backside of the wafer W from the mounting table 6 to prevent foreign particles from sticking to the wafer W, one of which is installed at a center of a wafer W mounting region of the mounting table 6. Further, formed through the mounting table 6 are through holes 63, through which the substrate support pins 64 serving as the substrate elevating mechanism protrudes and subsides. In the heating unit BAKE configured as described, the transfer arm 4A (4B, 4C) enters into the coating unit COT through the transfer openings 42 on the partition wall 41 while maintaining the wafer W horizontally, and the wafer W is places at a predetermined transfer position, e.g., a position above a substrate support region of the spin chuck 5. Then, the wafer W is transferred on the substrate support pins 64 in cooperation with the substrate support pins 64 and the substrate support pins 64 are then lowered such that the wafer W is mounted on the mounting table 6. After the wafer W mounted on the mounting table 6 is heated at a predetermined temperature, the wafer W is unloaded from the unit in a reverse order described above.

Figure 6:
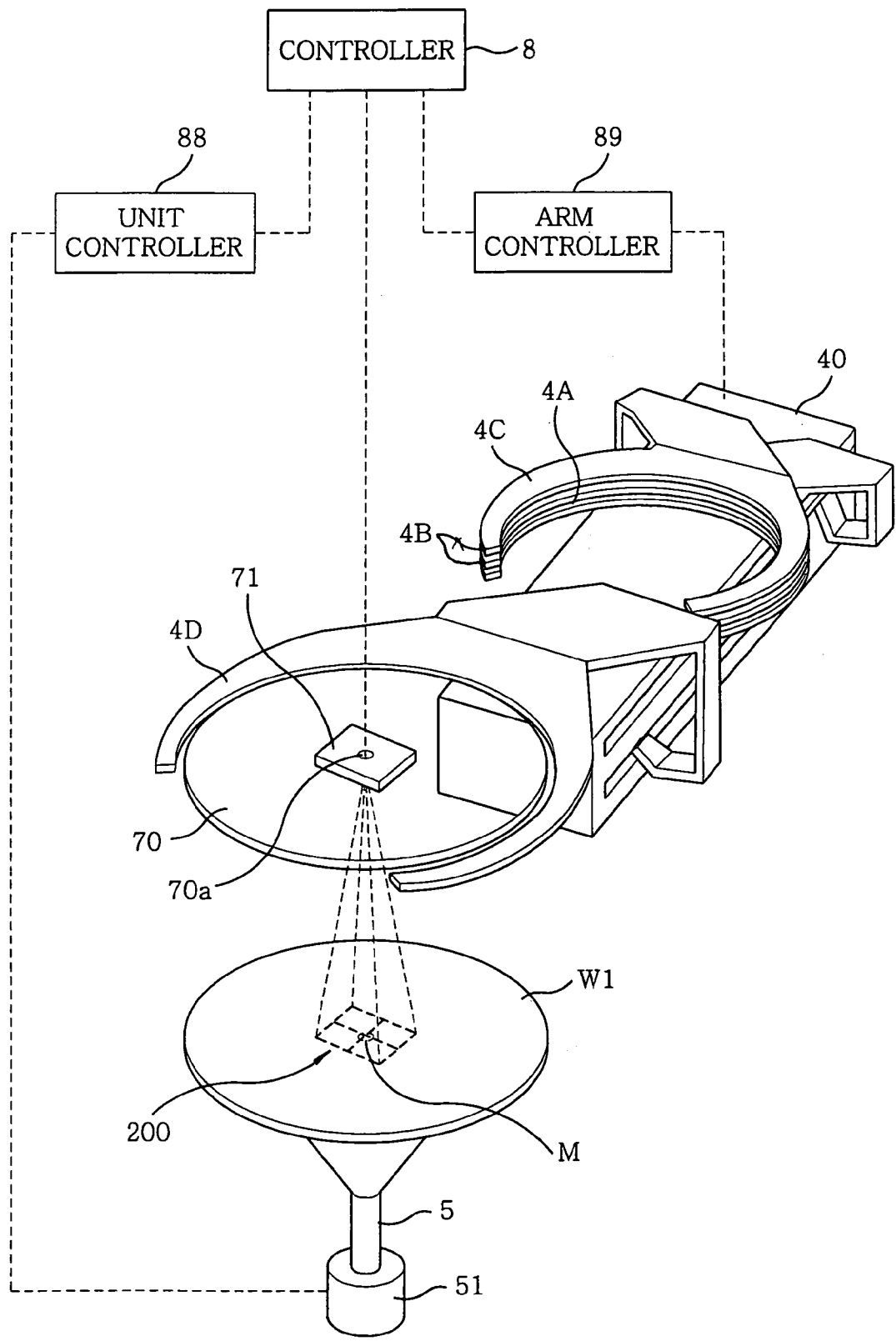
FIG. 6 depicts a perspective view for describing a figure of monitoring a wafer for use in position alignment by attaching a CCD camera to a main transfer mechanism.

Hereinafter, description of a teaching system incorporating the coating/developing apparatus therein described above will be provided with reference to FIGS. 6 and 7. In FIG. 6, a reference numeral W1 is a wafer for use in a position alignment in a teaching process and a circular mark M having a diameter of, e.g., 5 mm is formed at a predetermined location thereon, e.g., a center thereof. Reference numeral 70 represents a jig 70 having a size identical to, e.g., that of the wafer W1. The jig 70 has a hole 70a at a central region thereof, and e.g., a CCD camera 71 serving as a monitoring device is installed on an upper surface of the jig 70. The CCD cameral 71 monitors a region therebelow through the hole 70a. Specifically, in the teaching process, the jig 70 is guided to a position facing the surface of the wafer W1 mounted on the spin chuck 5 while being horizontally sustained on the teaching transfer arm 4D like the wafer W1, thereby allowing the CCD camera 71 to monitor the mark M of the wafer W1. The CCD camera 71 is connected to a controller 8 serving as a control system of the teaching process via, e.g., a wiring.

Figure 7:
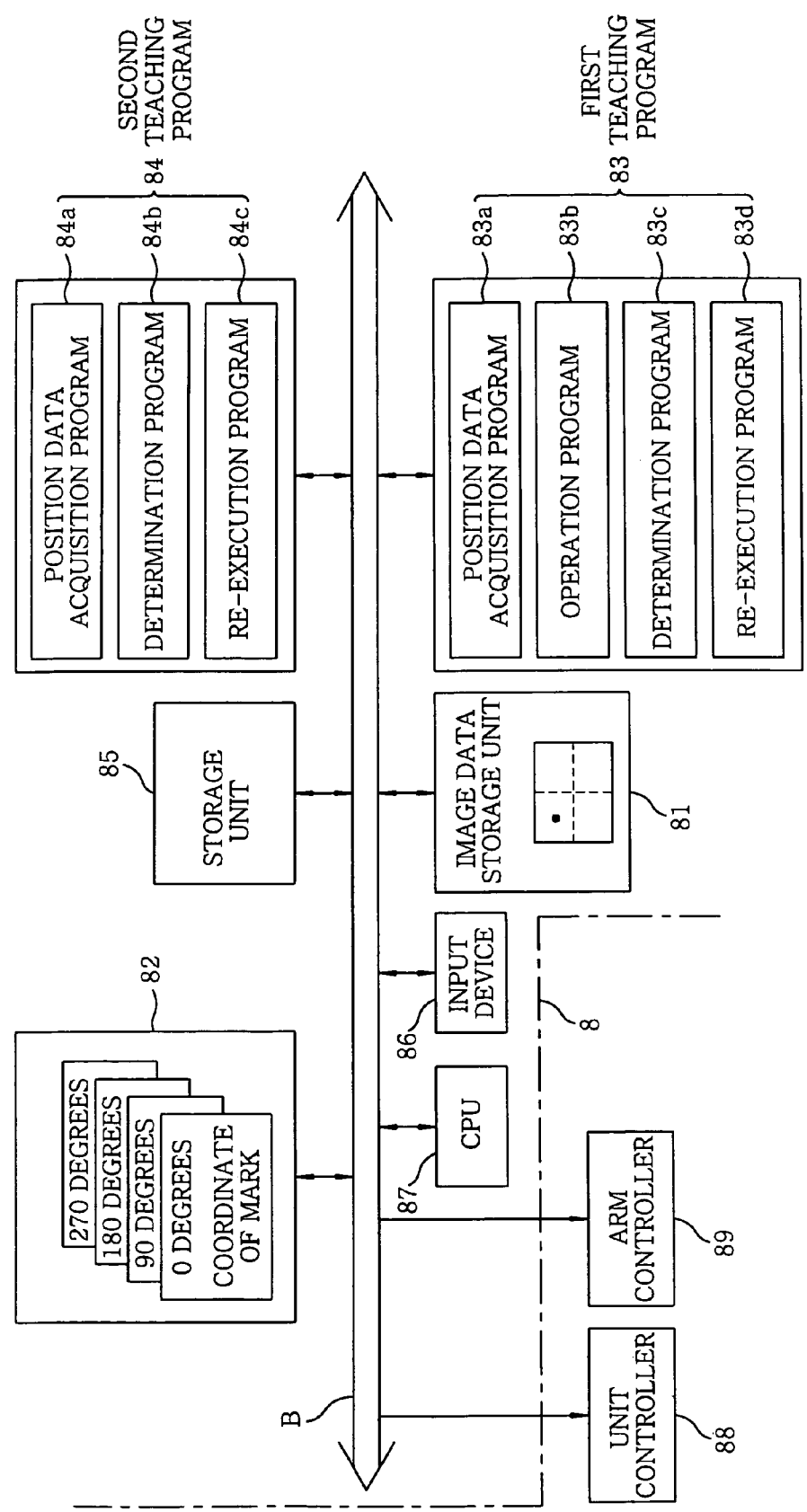
FIG. 7 explains a teaching mechanism employed in the coating/developing apparatus.

The controller 8 will be explained in detail. In FIG. 7, a reference numeral 81 represents an image data storage unit for storing image data obtained by the CCD camera 71; a reference numeral 82 refers to a working memory for temporarily storing a position (X and Y coordinates) of the mark M on the wafer W1 with respect to each rotation position of the spin chuck 5; and reference numerals 83 and 84 indicate a first and a second teaching program, respectively. Though the programs 83 and 84 are actually stored in the storage, the reference numerals are assigned to the programs for the convenience of explanation. In this preferred embodiment, data of transfer operations of the main transfer mechanisms A2 and A3 are obtained for each of the cases where a mounting table of a processing unit, e.g., the coating unit COT, rotates and where a mounting table of a processing unit, e.g., the heating unit BAKE, does not rotate. For such reason, the first teaching program 83 is designed to perform a teaching with respect to, e.g., the coating unit COT while the second teaching program 83 is provided to perform a teaching with respect to, e.g., the heating unit BAKE. The first teaching program 83 includes a position data acquisition program 83a for obtaining a position (X and Y coordinates) of the mark M with respect to each of rotation positions of the spin chuck 5 based on the image data attained at each thereof by the CCD camera 71; an operation program 83b for calculating an amount of misalignment between a rotation center of the spin chuck 5 and the center of the wafer W based on the position of the mark M with respect to each of rotation positions of the spin chuck 5; a determination program 83c for determining a presence of misalignment based on the result obtained by the operation program 83b; and a re-execution program 83d for adjusting (re-executing) the wafer W1 by using the transfer arm 4A (4B, 4C) when determining there is the amount of the misalignment.

The second teaching program 84 includes a position data acquisition program 84a for obtaining a position of a protrusion 62 capable of being a center mark of the mounting table 6 of the heating unit BAKE and the position of the mark M on the wafer W1 based on the image data obtained by the CCD camera 71; a determination program 84b for calculating a misalignment between the position of the protrusion 62 and the mark M of the wafer W1 based on the results obtained by the position data acquisition program 84a and determining whether the amount of misalignment falls within a predetermined tolerance range; and a re-execution program 84c for adjusting the wafer W1 by using the transfer arm 4A (4B, 4C) when the misalignment amount is out of the tolerance range.

Further, a reference numeral 85 in FIG. 7 represents a storage unit for storing a position where the center of the wafer W1 and the rotation center of the spin chuck 5 coincides with each other or a wafer transfer position of each of the transfer arms 4A to 4C with respect to each processing unit measured at a time when an amount of misalignment of the center of the wafer W1 and the position of the protrusion 62 serving as the center mark of the mounting table 6 is within the tolerance range. That is, stored in the storage unit 85 is data of transfer positions of the transfer arms 4A to 4C that are learned through the teaching process and defined by using R, θ, and Z values as explained above. Further, a reference numeral 86 is an input device made up of, e.g., a manipulation panel, and the input device displays an operation screen in, e.g., the teaching process. A reference numeral 87 represents a CPU while a reference numeral 88 designates a unit controller for controlling a processing unit based on a control signal provided from the controller 8. A reference numeral 89 is an arm controller for controlling the main transfer mechanisms A2 and A3 based on a control signal from the controller 8. A reference character B represents a bus.

Figure 8A:
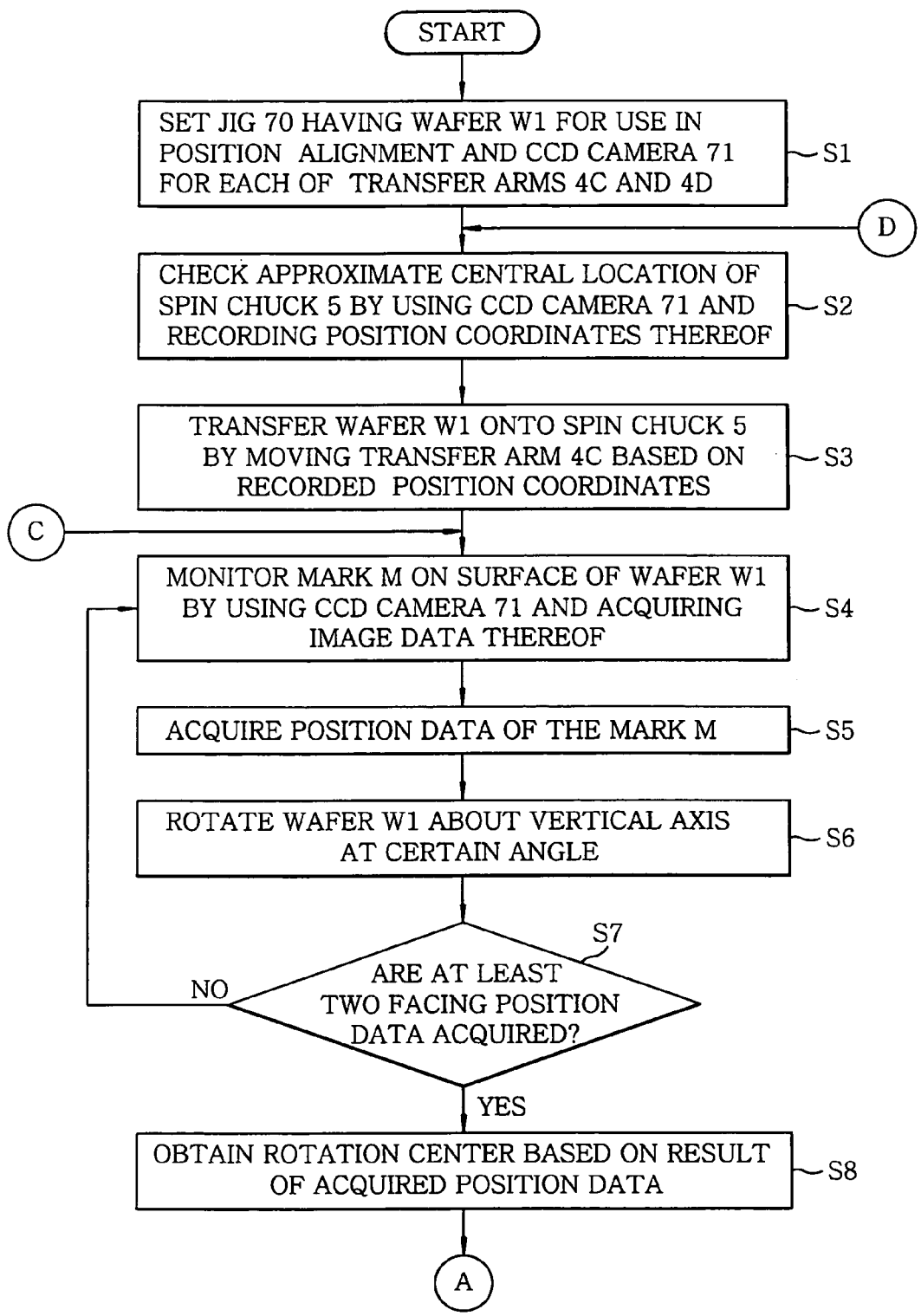
FIGS. 8A to 8C set forth a flowchart describing a teaching process.
Figure 8B:
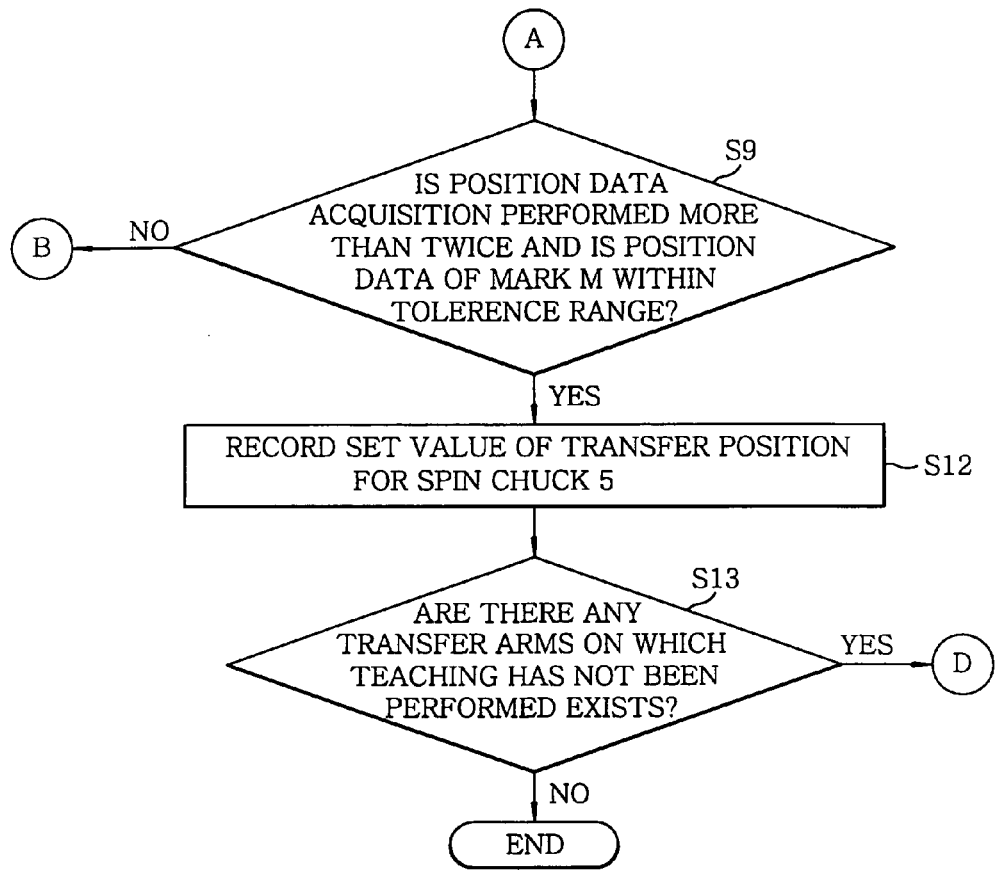
Figure 8C:
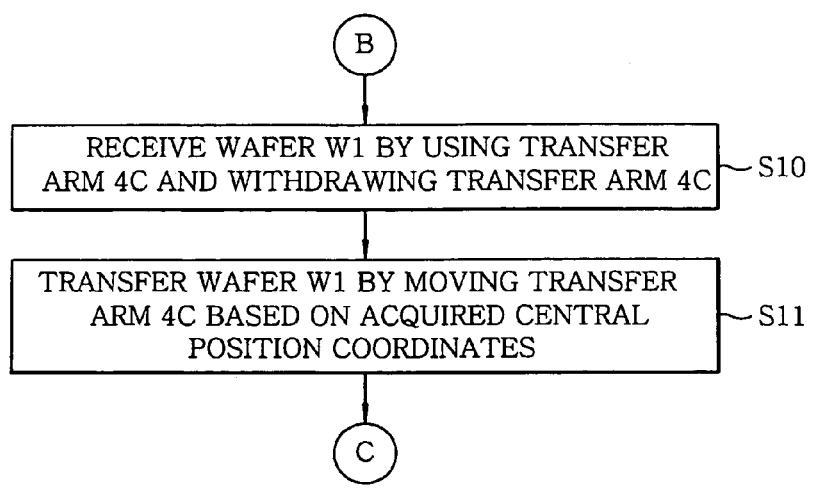

Processes for performing a teaching of the transfer arms 4A to 4C will now be described with reference to FIGS. 8 and 9. Herein, however, the process will be described for the case of a coating unit COT having a function of rotating a wafer W1. First, as a pre-preparation shown in step S1, the position alignment wafer W1 is supported on, e.g., the upper transfer arm 4C on which the teaching is to be conducted and, at the same time, the jig 70 is supported on the teaching transfer arm 4D. Subsequently, the transfer arm 4D is extended forward by referring to a position of the spin chuck 5 stored based on, e.g., a design data and, at the same time, a substantially central portion of the spin chuck 5, e.g., a position of a vacuum hole formed at a central portion of the surface of the spin chuck 5 in order to attract the backside of the wafer W, is searched while the CCD camera 71 monitors the spin chuck 5 (step S2), whereby the center of the spin chuck 5 becomes to be located at about a central portion of a monitored region of the jig 70 supported on the transfer arm 4D. A position coordinates of the transfer arm 4D at that time is stored in the working memory 82. Thereafter, the transfer arm 4C is advanced based on such position coordinates to thereby locate the wafer W1 to the transfer position. Then, the wafer W1 is transferred from the transfer arm 4C onto the spin chuck 5 via the substrate support pins 56 in the coating unit COT as described above (step S3).

Figure 9A:
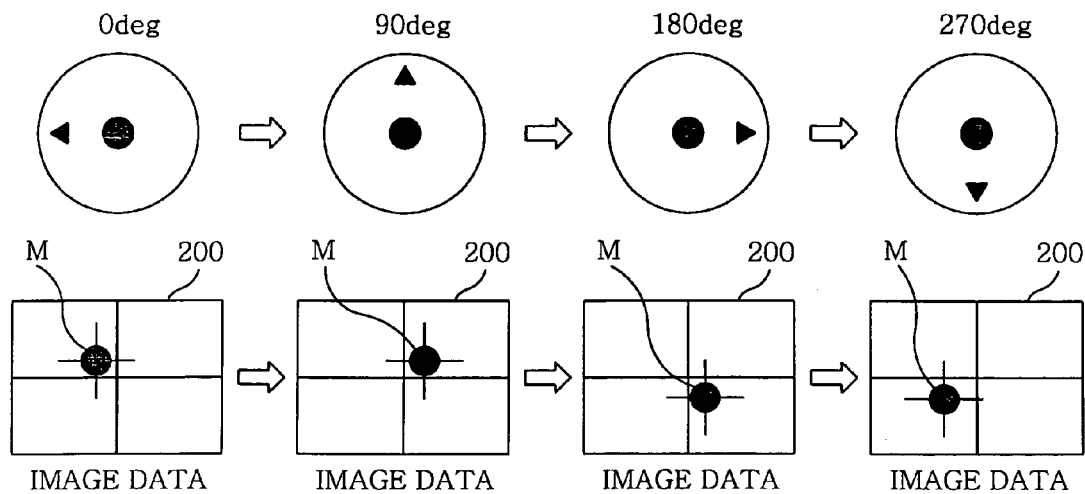
FIGS. 9A and 9B describe image data obtained in the teaching process.

Next, the transfer arm 4C is withdrawn from the unit, and the transfer arm 4D supporting the jig 70 enters thereinto based on data of position coordinates acquired in the step S2. The jig 70 is guided to a location facing a surface of the wafer W1 maintained on the spin chuck 5 to thereby monitor a mark M on the surface of the wafer W1 by a CCD camera 71. An image data 200 obtained by the monitoring is recorded in the image data storage unit 81. Then, based on a position data acquisition program 83a, position data in a monitored region of the image data 200, i.e., position coordinates data such as $X_1$ and $Y_1$, is acquired by a calculation and then recorded in a working memory 82 (step S5). Thereafter, as illustrated in a step S6, a rotation of the spin chuck 5 is controlled by the unit controller 88, so that the wafer W1 is rotated at a certain angle of, e.g., every 90 degrees, about a vertical axis and position data for each phase is respectively acquired in the same manner. The position data can be acquired from at least two positions and even-numbered positions facing each other at an angle of 180 degrees before and after the rotation. As illustrated in FIG. 9A, in case the position data are obtained from four positions of, e.g., 0 degree, 90 degrees, 180 degrees and 270 degrees, as in this example, the steps S4 to S6 are iteratively performed until all of the position data thereof is acquired (step S7).

Figure 9B:
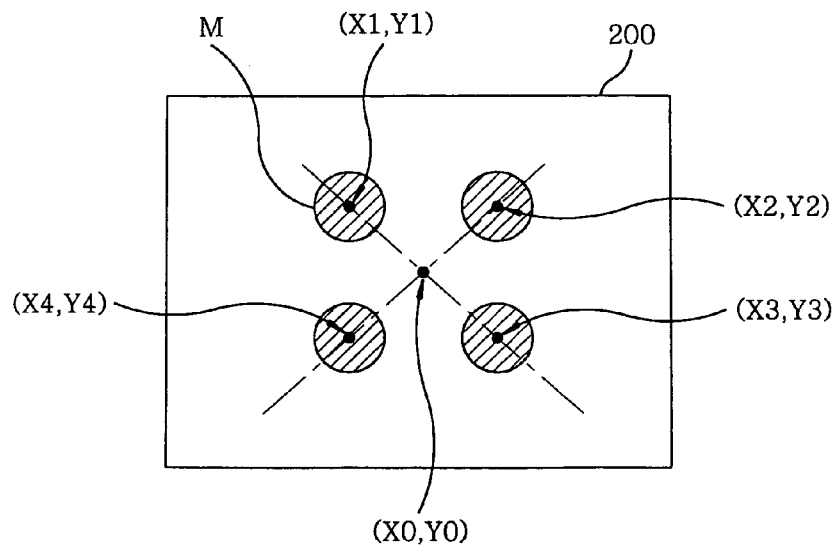

As shown in a step S8, a center of a rotation axis is searched by an operation program 83b based on the position data of the four positions acquired by the position data acquisition program 83a. To be specific, as illustrated in FIG. 9B, a point ($X_0=0$, $Y_0=0$) where a straight line connecting the position data of 0 degree and 180 degrees intersects that connecting the position data of 90 degrees and 270 degrees is set as the center of the rotation axis and then recorded in the working memory 82 as central position coordinates corresponding to the transfer arm 4C. Further, in case the position data of, e.g., two positions, are acquired, position coordinates corresponding to a middle point of a straight line connecting the two position data are set to be the central position coordinates of the rotation axis. Next, the transfer arm 4C receives the wafer W1 mounted on the spin chuck 5 and then is withdrawn from the unit to an outside thereof (step S10). Based on the central position coordinates obtained from the position data acquired in the step S8, the wafer W1 is transferred on the spin chuck 5 (step S1), and then the steps S4 to S8 are performed to acquire data for a second time. Herein, as illustrated in the step S9, after acquiring the position data for the second time, if position coordinate values of the mark M on the surface of the wafer W1 are not a single value or out of a predetermined tolerance range, a determination program 83c detects a misalignment. In case the misalignment is detected, as shown in the step S10, in which the transfer arm 4C receives the wafer W1 mounted on the spin chuck 5 and then is withdrawn from the unit to an outside thereof (step S10), θ and R are revised to reduce the misalignment of both position coordinate values based on a re-execution program 83d, i.e., based on the central position coordinates obtained from the position data acquired in the step S8 the wafer W1 is transferred on the spin chuck 5 (step S11), and the steps S4 to S8 are carried out again based on revised position coordinate values. The aforementioned tolerance range is determined depending on, e.g., types of processing units. For example, in case of a coating unit (COT), the tolerance range is set to be an eccentricity of smaller than or equal to 0.1 mm; in case of a developing unit (DEV), it is set to be an eccentricity of smaller than or equal to 0.3 mm; and in case of a bake unit to be described later, it is set to be a distance difference of smaller than or equal to 0.5 mm. Next, if it is determined in the step S9 that the position data are identical (there is no misalignment), a set value of a transfer position is recorded in the storage unit 85 as a set value of the transfer arm 4C for the corresponding coating unit (COT) as illustrated in the step S12, thereby completing a teaching of the transfer arm 4C. A position alignment accuracy can be enhanced by checking whether or not there exists an eccentricity in a rotation locus of the mark M while rotating the wafer W1.

Thereafter, as depicted in the step S13, in case there are additional transfer arms 4B and 4A on which a teaching has not been performed, the middle transfer arm 4B enters into an unit to receive the wafer W1 from the spin chuck 5 and then is withdrawn therefrom. By returning to the step S2, the teaching of the transfer arm 4B is started. When the teaching of the middle transfer arm 4B is completed, the teaching of the lower transfer arm 4A is performed in the same manner. Further, it is sufficient that any one of the transfer arms 4A to 4C is performed in other processing unit after the position alignment of the transfer arms 4A to 4C is performed in the standard processing unit, e.g., the unit carrying out the teaching first. It is because relative position data with respect to the one tranfer postion are previously acquired in the remaining transfer arms.

In accordance with the aforementioned embodiment, the wafer W1 identical to an actual substrate to be processed has the mark M formed on the surface thereof and is maintained on the spin chuck 5. By a configuration in which the center of the rotation axis is searched based on the locus of the mark M obtained by rotating the wafer W1, the misalignment between the center of the wafer W1 and that of the rotation axis can be simply quantified. Therefore, a set point (corrected value) in re-execution can be set by a simple correction. As a result, it is possible to match the center of the wafer W1 with that of the rotation axis with a fewer re-executions, so that the teaching can be carried out in a short period of time. Further, in case of using a light transmitting sensor described in the "Background of the Invention", the re-execution needs to be performed five times at maximum in order to control an accuracy of, e.g., 50 μm. However, in accordance with the present invention, the inventors have observed that the same accuracy can be achieved with fewer re-executions, e.g., twice. The inventors of the invention explain the reason thereof as follows. For example, in case a peripheral portion of the wafer W1 is detected by the light transmitting sensor, it is assumed that each of the sensor and the transfer arm has a coordinate system and, therefore, the transfer arm enters in a direction perpendicular to a moving direction of the light transmitting sensor. Further, data obtained by a single detection is one directional (X or Y direction) data. For example, by rotating the wafer W1 at an angle of every 90 degrees, two position data in the X direction and those in the Y direction are acquired.

In the preferred embodiment of the present invention, since a coordinate system of a corresponding CCD camera 71 and that of the transfer arms (4A to 4D) are joined for each processing unit by installing the CCD camera 71 at the transfer arm 4D and the position data of the mark M, which are obtained during the first detection (monitoring), specify both coordinates of X and Y, four data points in the X direction and those in the Y direction can be resultantly acquired by rotating the wafer W1 at an angle of every b 90 degrees. From these differences, the preferred embodiment of the present invention has a high accuracy in the misalignment information of the wafer W1, thereby the number of re-execution is reduced. Time period for a single trial is about 2 minutes but because a large number of trials is carried out in a plural processing unit, a large amount of time can be resultantly reduced.

Moreover, in order to find a rotation center of the spin chuck 5, position data of the mark M needs to be acquired from at least two rotation regions. In this example, the position data of the mark M are acquired from four different rotation positions being spaced from each other at an angle of 90 degrees, and the rotation center is determined to be an intersection point of straight lines connecting different coordinates being apart from each other at an angle of 180 degrees, thereby making an operation process easy. Further, in case position data are acquired from two positions and position coordinates of a middle point of a straight line connecting the position data, i.e., position coordinates of the middle point of the corresponding straight line is set to be central position coordinates, the center of the rotation axis can be obtained with fewer position data. Moreover, a case of fewer acquired position data is advantageous in that the teaching can be carried out in a shorter period of time.

Furthermore, in accordance with the aforementioned embodiment, by a configuration in which the jig 70 having the CCD camera 71 as a monitoring device is supported by the transfer arm 4D and, at the same time, guided to a monitored location in a unit by the transfer arm 4D, time and effort put in by operator can be considerably reduced in comparison with a case where a sensor is provided in the unit. As a result, teaching time can be decreased and, further, a burden of the operator can also be reduced.

Figure 10A:
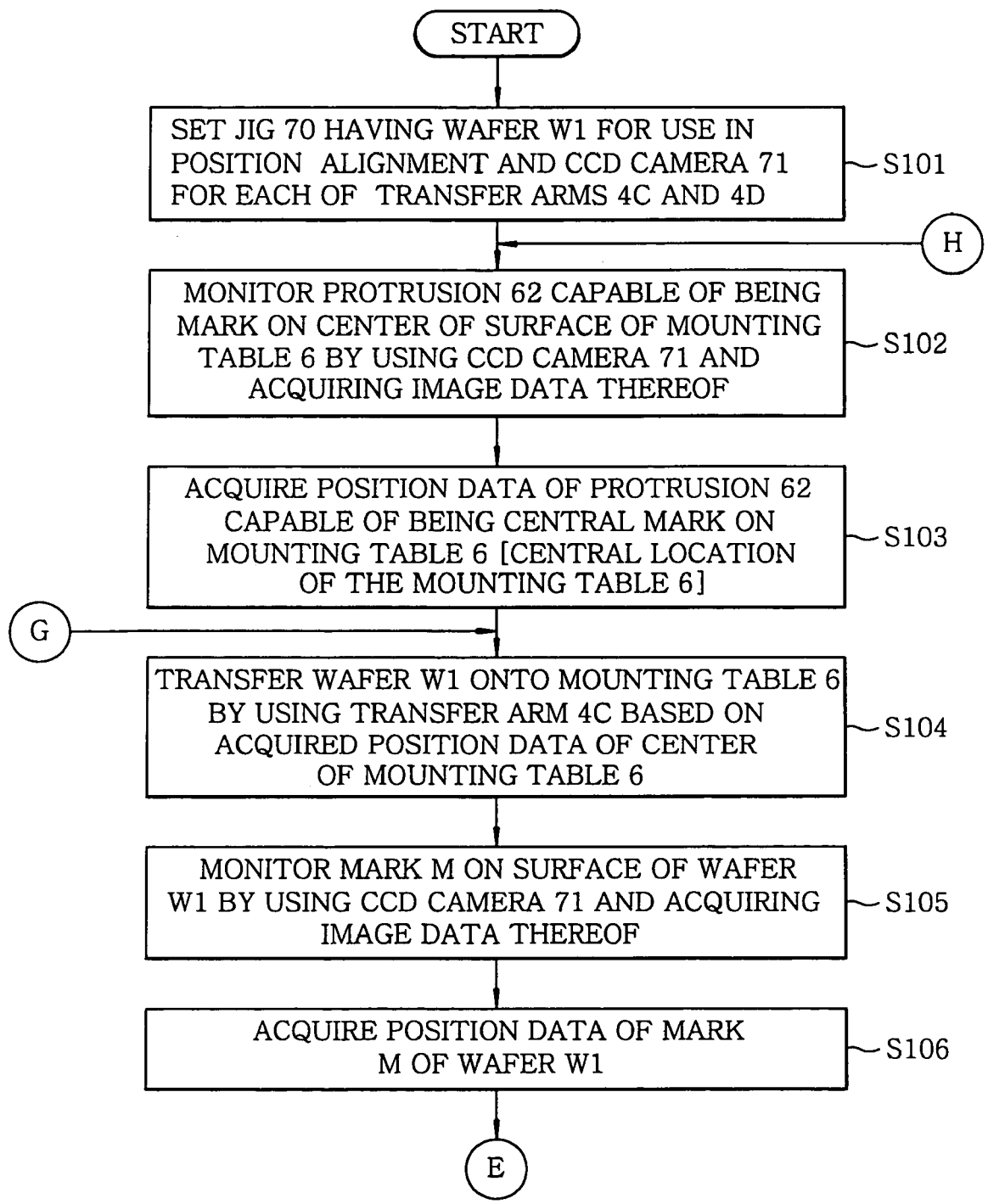
FIGS. 10A to 10C present a flowchart providing another example of teaching process.
Figure 10B:
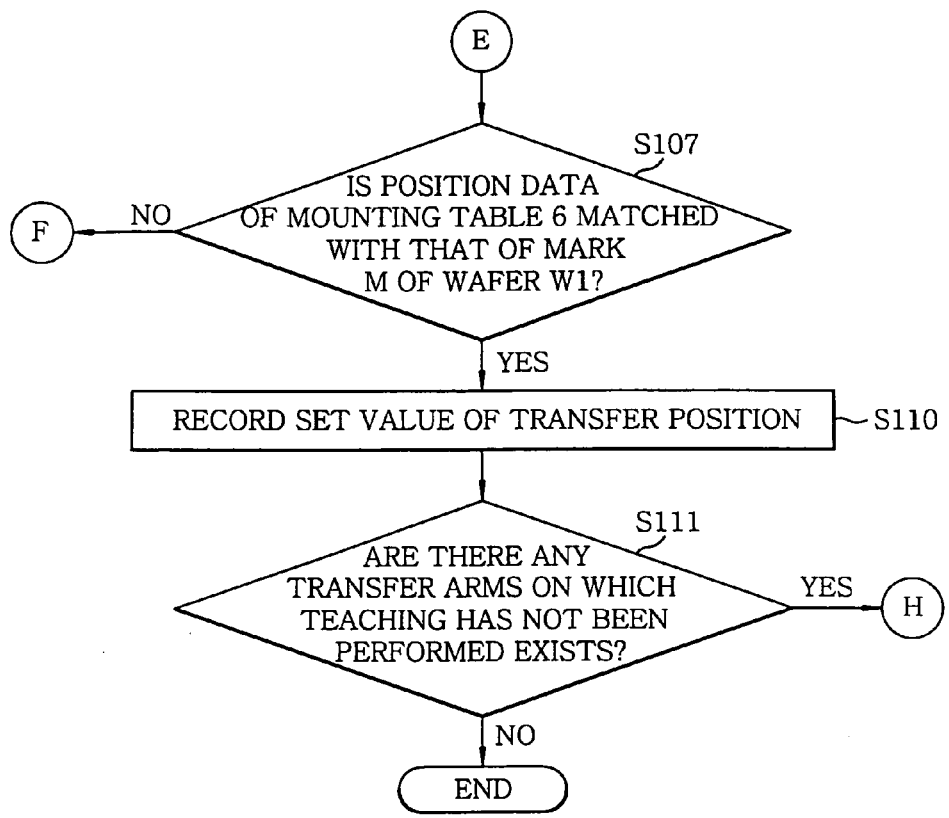
Figure 10C:
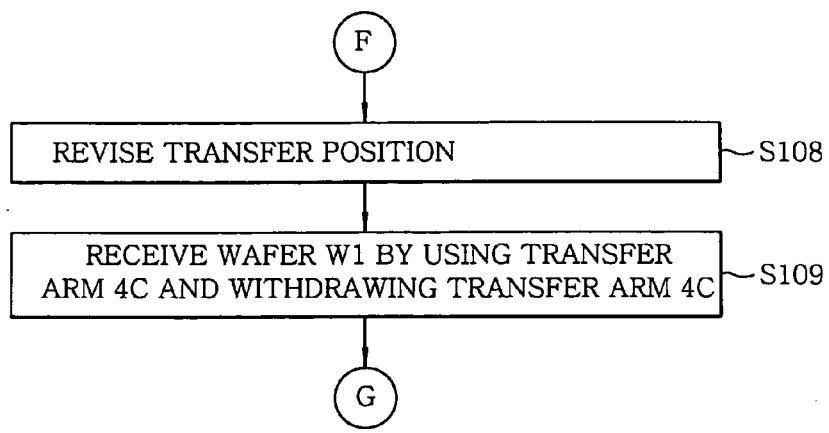
Figure 11:
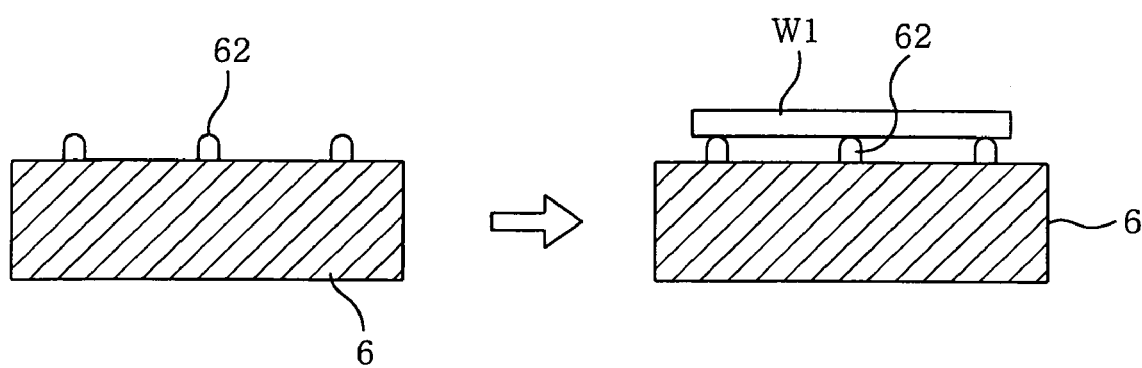
FIG. 11 illustrates image data obtained in the teaching process of FIG. 10.
Figure 11:
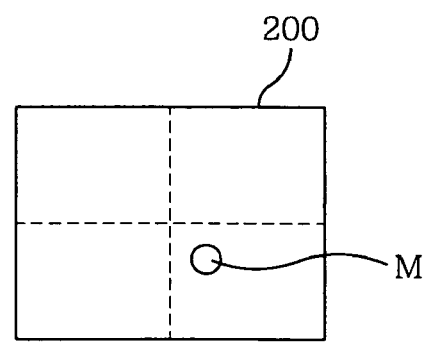

Hereinafter, a process using the bake unit, i.e., a processing unit having no function of rotating the wafer W1, will be described with reference to FIGS. 10 and 11. As shown in a step S101, as a pre-preparation, a position aligning wafer W1 is supported by the upper transfer arm 4C on which a teaching will be performed and, at the same time, the jig 70 is supported by the teaching transfer arm 4D for use in only teaching. Subsequently, the transfer arm 4D is stopped at a location extending to a forward direction thereof corresponding to the central location of the bake unit memory based on, e.g., designed data. Further, a protrusion 62 is monitored to thereby record the image data 200 in the image data storage unit 81 (step S102), wherein the protrusion 62 can be a mark of a center of a wafer mounting region on the mounting table 6. Position coordinates of the protrusion 62 corresponding to the center of a monitored region of the image data 200 [position data of the center of the mounting table 6] are acquired by the position data acquisition program 84a and then recorded in the working memory 82 (step S103).

Thereafter, the transfer arm 4D is withdrawn from the unit and, at the same time, the transfer arm 4C moves forward based on the position coordinates, so that the wafer W1 can be provided at a transfer position. At this time, in the bake unit (BAKE), the wafer W1 is transferred from the transfer arm 4C to the mounting table 6 via a substrate supporting pins 64, as described above (step S104). Next, the transfer arm 4C is withdrawn from the unit, and the upper transfer arm 4D supporting the jig 70 enters thereinto based on the central position coordinates data acquired in the step S103 and then is guided to a location facing the surface of the wafer W1 maintained on the mounting table 6. As illustrated in a step S105, the mark M on the surface of the wafer W1 is monitored by the CCD camera 71, so that the image data 200 thereof is recorded in the image data storage unit 81. Further, position coordinates, i.e., the position data of the mark M, are acquired by the acquisition program 84a and then recorded in the working memory 82 (step S106).

As illustrated in the step S107, the decision program 84b is read and the position data of the wafer W1 is compared with that of the center of the mounting table 6. As long as the position data exist within the tolerance range whether they are identical or not, the wafer W1 is considered to be located at an appropriate position. Meanwhile, if the position data are not identical and, further, do not exist within the tolerance range, values of the θ and the R are revised so as to reduce the misalignment between the position data based on the re-execution program 84c (step S108). Then, the transfer arm 4C receives the wafer W1 on the mounting table 6 and then is withdrawn from the unit (step S109). After setting the revised transfer position with a new set value, the steps S104 to S106 are performed again. Thereafter, if it is determined in the step S107 that the position data are identical, the set value of the transfer position in that time is recorded in the storage unit 85 as a set value of the transfer arm 4C for the corresponding bake unit, as illustrated in a step S110, thereby completing the teaching of the transfer arm 4C.

Next, as can be seen from a step S111, if there is an additional transfer arm on which a teaching has not been performed, the middle transfer arm 4B, on which a teaching will be performed, enters into the unit and receives the wafer W1 and then is withdrawn therefrom. By performing the steps S104 to S110, the teaching of the transfer arm 4B is carried out. When the teaching of the middle transfer arm 4B is completed, the teaching of the lower transfer arm 4A is performed in the same manner.

In accordance with the aforementioned embodiment, even if a target processing unit has no function of rotating the wafer W1, it is possible to easily check whether or not there is a misalignment to a certain extent by comparing the central position data of the wafer W1 with that of the mounting table 6. Further, since a new set value (corrected value) can be simply set to reduce the misalignment, the same effects of the aforementioned case can be obtained. This example is not limited to the configuration in which the transfer position is controlled and, further, it can be used only as a device for checking whether or not the wafer W1 is mounted on a predetermined location based on the decision result obtained in, e.g., the step S107.

Figure 12A:
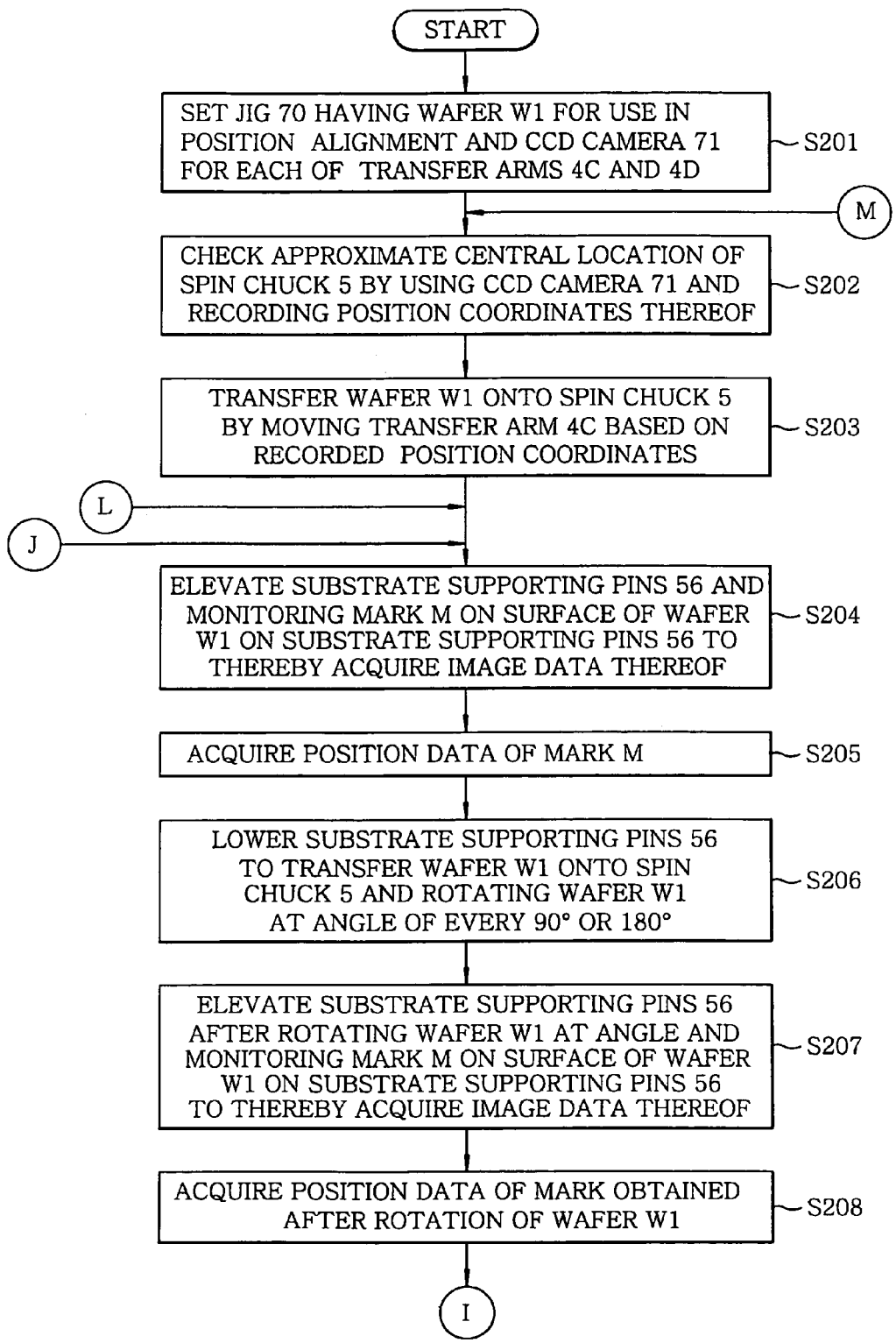
FIGS. 12A to 12C are a flowchart for explaining still another example of teaching process.
Figure 12B:
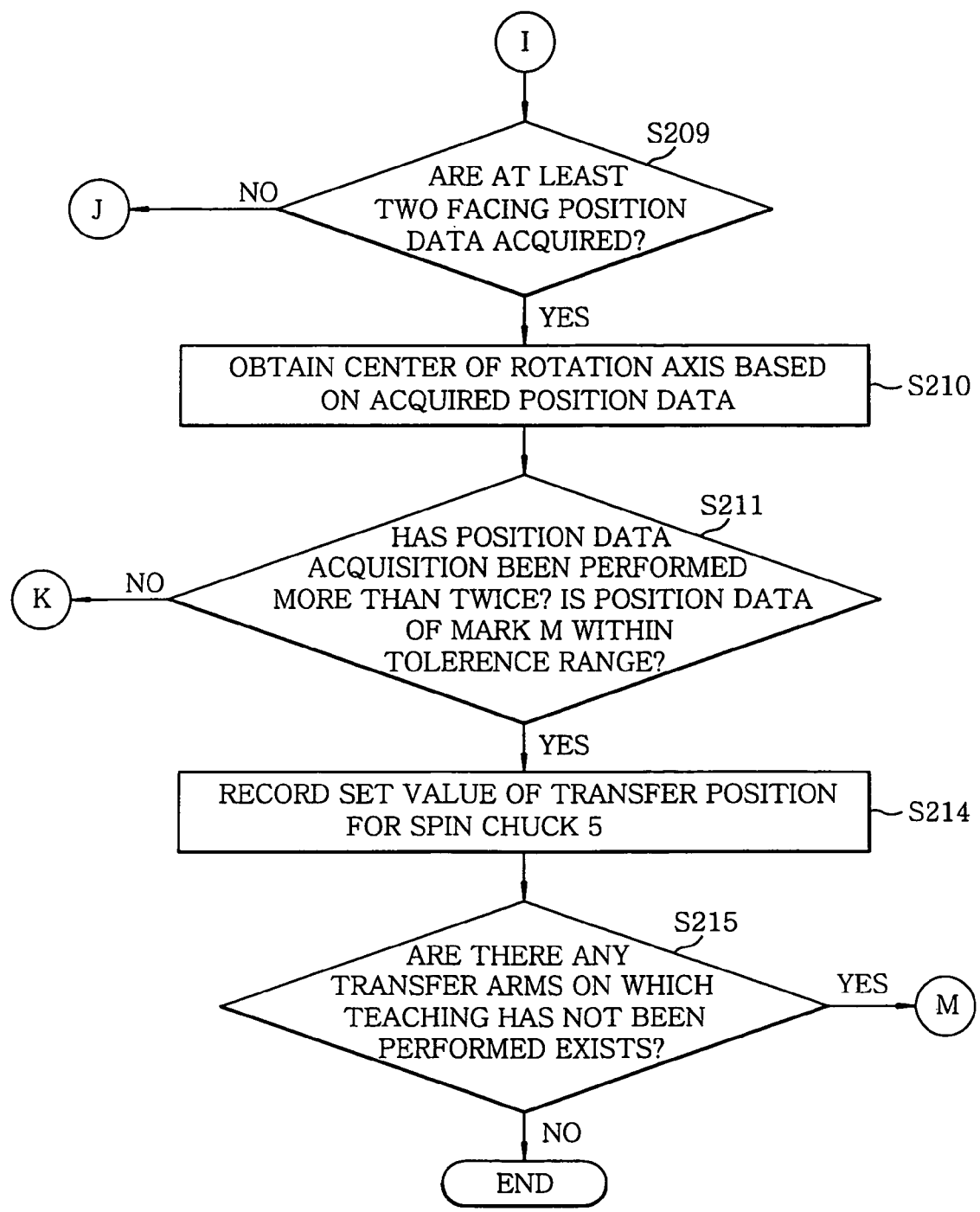
Figure 12C:
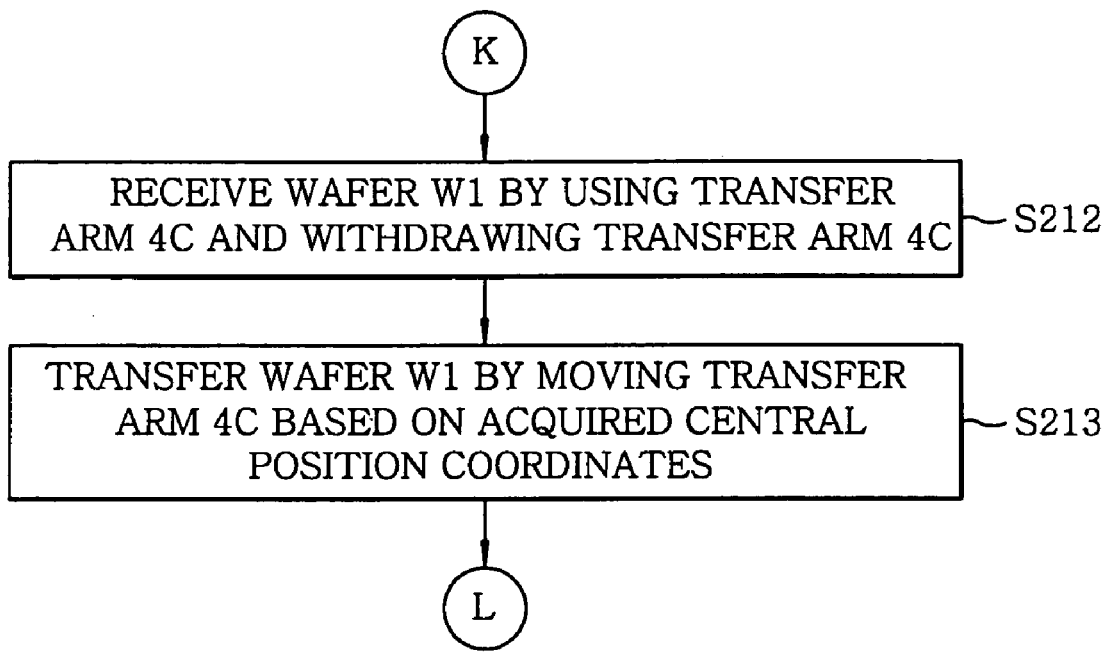

Hereinafter, an example of another process for performing the teaching of the aforementioned coating unit (COT) will be described with reference to FIG. 12. Detailed operations in each step are the same as those of the example illustrated in FIG. 8 except for the wafer W1 monitored at a state supported by the substrate supporting pins 56. First of all, the position aligning wafer W1 is supported on the transfer arm 4C and, at the same time, the jig 70 is supported on the transfer arm 4D (step S201). Next, by extending the transfer arm 4D forward (in a direction of the R-axis), the spin chuck 5 is monitored by the CCD camera 71, thereby checking an approximate central location thereof. Then, position coordinates thereof are recorded in the working memory 82 (step S202). Subsequently, the transfer arm 4C moves forward based on the recorded position coordinates, and the wafer W1 is transferred onto the spin chuck 5 by a cooperative operation between the substrate supporting pins 56 and the transfer arm 4C (step S203).

Thereafter, the transfer arm 4C is withdrawn from the unit to the outside thereof, the substrate supporting pins 56 are elevated to locate the wafer W1 near an elevated location (monitored location), e.g., the transfer position with the transfer arm 4C, and, at the same time, the transfer arm 4D supporting the jig 70 enters into the unit. Then, the mark M of the wafer W1 on the substrate supporting pins 56 is monitored by the CCD camera 71 (step S204). That is, the mark M is monitored in such a way that the wafer W1 as an object to be monitored is located adjacent to the CCD camera 71 by the substrate supporting pins 56. Such monitored image data obtained from the location of 0 degrees is recorded in the image data storage unit 81. Next, position data is acquired based on the position data acquisition program 83a and then recorded in the working memory 82 (step S205). Subsequently, the substrate supporting pins 56 are lowered to transfer the wafer W1 on the spin chuck 5. The wafer W1 is rotated by the corresponding spin chuck 5 about the vertical axis at an angle of, e.g., every 90 degrees or 180 degrees, to thereby acquire facing position data of the mark M (steps S206 to S208). Further, the steps S204 to S208 are iteratively performed until position data are acquired from at least two positions and, e.g., even-numbered positions facing each other at an angle of 180 degrees before and after the rotation. (step S209).

Thereafter, as can be seen from a step S210, a center of a rotation axis is searched by the operation program 83b based on the acquired position data. Specifically, it is checked whether or not a misalignment exists between position coordinates corresponding to the location of 0 degree obtained in the step S205 and that obtained in the step S202 (position coordinates of the central axis acquired in the previous step S210 since the second time). If it is determined that there is no misalignment, the center of the rotation axis is determined to be position coordinates of a middle point of a straight line connecting position data of two positions of, e.g., 0 degree and 180 degrees or 90 degrees and 270 degrees. In the meantime, if it is determined that there is a misalignment between both position coordinates due to a horizontal movement of a corresponding wafer W1 by an air bearing phenomenon or the like caused when the wafer W1 is lowered, a direction and an amount of the misalignment are obtained by an operation, thereby revising each position data. The position coordinates of the middle point of the straight line connecting the facing position data obtained after the revision are set to be central position coordinates of the central rotation axis.

The first data acquisition is completed in such a manner and, then, the transfer arm 4C receives the wafer W1 from the substrate supporting pins 56 and then is withdrawn from the unit to the outside thereof (steps S211 and S212). Then, based on the aforementioned central position coordinates, the transfer arm 4C enters into the unit and then transfers the wafer W1 on the spin chuck 5 by the cooperative operation with the substrate supporting pins 56 (step S213). In the same manner, by performing the steps S204 to S210, a second data acquisition is carried out. However, after the second data acquisition, if the position coordinates of the mark M on the surface of the wafer W1 after the rotation are the same or within the tolerance range, a set value of the transfer position is recorded in the storage unit 85 as a set value of the transfer arm 4C for the corresponding coating unit (COT), thereby completing the teaching of the transfer arm 4C (step S214).

Meanwhile, if the determination program 83c determines that the position coordinates of the mark M on the surface of the wafer W1 after the rotation are not the same or out of the tolerance range in the step S211, the transfer arm 4C receives the wafer W1 from the substrate supporting pins 56 and then is withdrawn from the unit to the outside thereof (step S212). Next, the transfer position obtained by revising the values of the θ and the R based on the re-execution program 83d to reduce the misalignment between the position data is set as a new set value. Thereafter, the transfer arm 4C enters into the unit to transfer the wafer W1 on the substrate supporting pins 56 (step S213). Then, the steps S204 to S210 are performed again.

Subsequently, as illustrated in a step S215, if there exists an additional transfer arm on which a teaching has not been performed, the middle transfer arm 4B enters into the unit to receive the wafer W1 from the spin chuck 5 and then is withdrawn therefrom. By retuning to the step S2, the teaching of the transfer arm 4B is carried out. Further, when the teaching of the transfer arm 4B is completed, the teaching of the lower transfer arm 4A is performed in the same manner.

Even with the above-described configuration, it is possible to simply check the amount of misalignment between the center of the wafer W1 S2 and that of the rotation axis based on the acquired position data, thereby providing the same effects of the aforementioned case. Further, since this example describes a case where the wafer W1 is monitored at a location near the CCD camera 71, an accuracy of an image data can be guaranteed even by using, e.g., a low priced CCD camera 71 having a short monitoring distance. To be specific, as will be further described later, the teaching can be performed while reducing the effects of elevating the wafer W1 by the substrate supporting pins 56 before and after the monitoring.

Figure 13A:
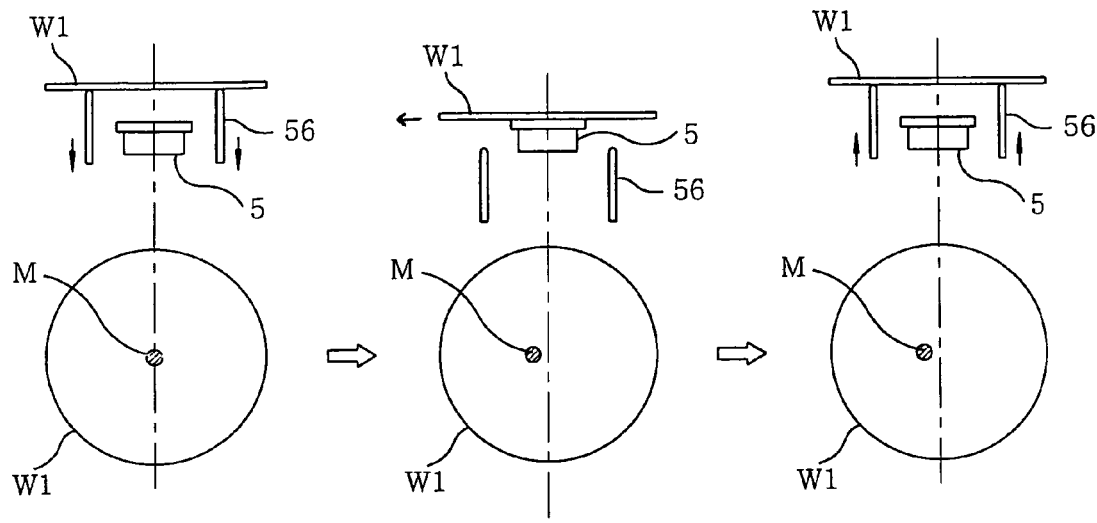
FIGS. 13A and 13B show wafer misalignments occurring when a wafer is lowered.

That is, while the wafer W1 is lowered by the substrate supporting pins 56, a horizontal misalignment can occur between the spin chuck 5 and the wafer W1 due to, e.g., an air bearing or the like as illustrated in FIG. 13A. Since an identical unit and a wafer having an identical size to that of the wafer W1 have an substantial reproducibility of the direction and the amount of the above-described misalignment, if the transfer position is determined by performing the teaching, the transfer position becomes constant for each wafer W1 during following processes. However, in this example, the wafer W1 is elevated by the substrate supporting pins 56 to be monitored in each rotation location. Accordingly, if the amount of misalignment at the location of 0 degree is different from that of 180 degrees, the central position coordinates of the rotation axis, which are obtained by the calculation, is deviated from an actual center of the rotation axis and the result of the teaching is not converged. Therefore, in this example, the direction and the amount of misalignment occurred when the wafer W is lowered are calculatedly obtained by using the position coordinates corresponding to the location of 0 degree, which are obtained in the step S205, and that obtained in the step S202 (position coordinates of the central axis acquired in the previous step S210 since the second time). Then, by revising the position coordinates according to performance times of the lowering movements of the wafer W1, effects of elevating the wafer W1 by the corresponding substrate supporting pins 56 can be prevented or reduced, if any.

Figure 13B:
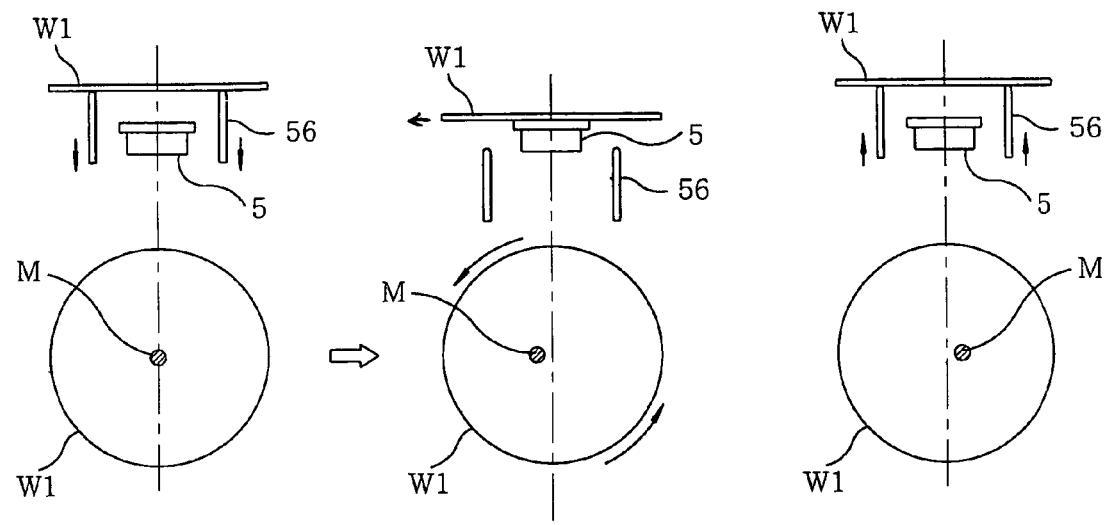

Further, in the aforementioned embodiment, after acquiring the position data of 0 degree, a location of the wafer W1 on the transfer arm 4C (4A, 4B), on which the teaching is being performed, can be adjusted before acquiring position data of 180 degrees facing that of 0 degree. A timing of transferring the wafer W1 to the transfer arm 4C (4A, 4B) is between, e.g, the step S205 and the step 206. In this case, by rotating it at an angle of 180 degrees after adjusting the wafer W1, the position data of 0 degree including the misalignment (see FIG. 13A) and that of 180 degrees including the misalignment (see FIG. 13B) are acquired to obtain the central location of the rotation axis, thereby providing the same effects of the aforementioned case. Furthermore, even though a processing unit has no function of rotating the wafer W1 unlike the aforementioned bake unit, the wafer W1 can be monitored in such a way that the wafer W1 is located adjacently to the CCD camera 71 by the substrate supporting pins 56. In this case, the teaching can be carried out by using, e.g., the low priced CCD camera 71.

The preferred embodiment of the present invention is not limited to a configuration using an arm only supporting the jig 70 as a monitoring device and, further, can be applied to a configuration that a jig is mounted to be changed by an operator. To be specific, in performing a teaching of the main transfer mechanism A2 (A3) having the three transfer arms 4A, 4B and 4C without the teaching transfer arm 4D for use in only teaching, the teaching of the additional transfer arm 4A (4B) is performed while supporting the jig 70 to the upper transfer arm 4C. Then, it is possible to perform the teaching of the corresponding transfer arm 4C by changing and mounting the jig 70 on an additional arm, e.g., the transfer arm 4A. Such configuration can provide the same effects of the aforementioned case.

Moreover, in the present invention, by installing a power supply such as a battery or the like at the jig 70 and, at the same time, providing a transmission device capable of wirelessly transmitting an image data, a corresponding CCD camera 71 without a wire can be obtained. Accordingly, such configuration in which the jig 70 is transferred between each of the transfer arms 4A to 4C through spin chuck 5 can be allowed. In this case, time and effort put in by the operator in changing and mounting the jig 70 can be reduced, so that the teaching can be performed in a short period of time.

Figure 14:
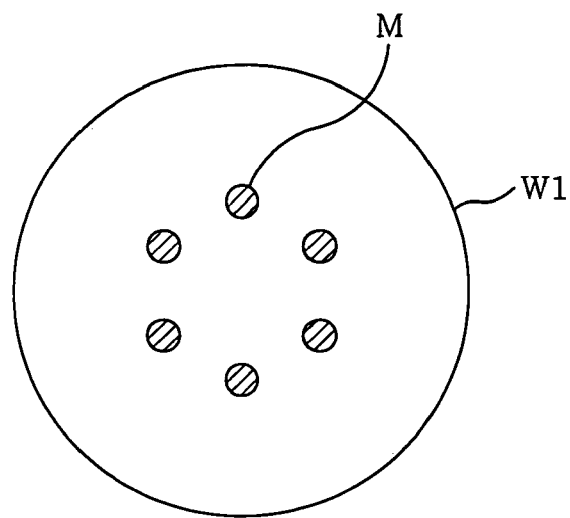
FIG. 14 illustrates an example of marks formed on a surface of a wafer for use in position alignment.
Figure 15:
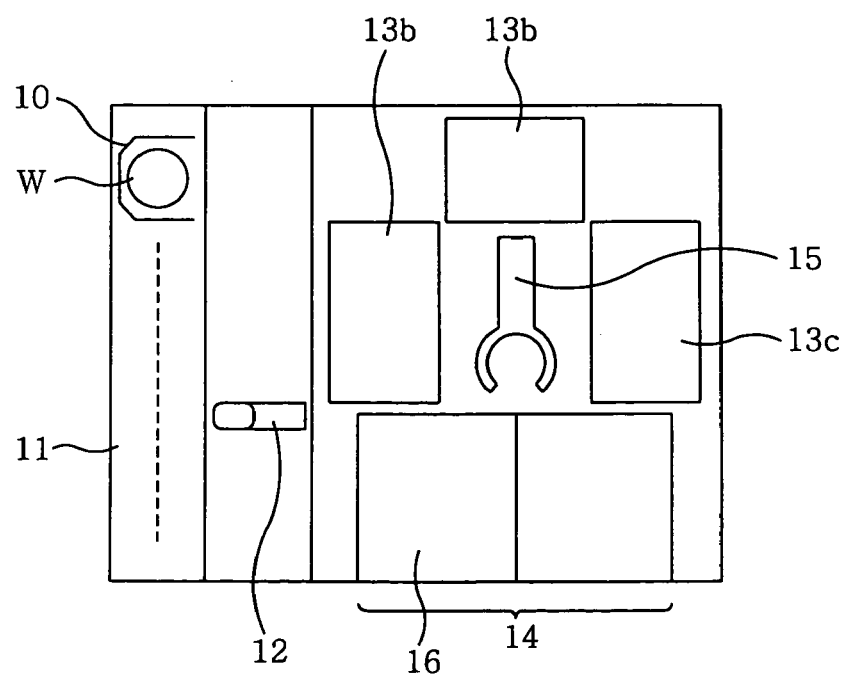
FIG. 15 offers a plan view of a conventional coating/developing apparatus.
Figure 16:
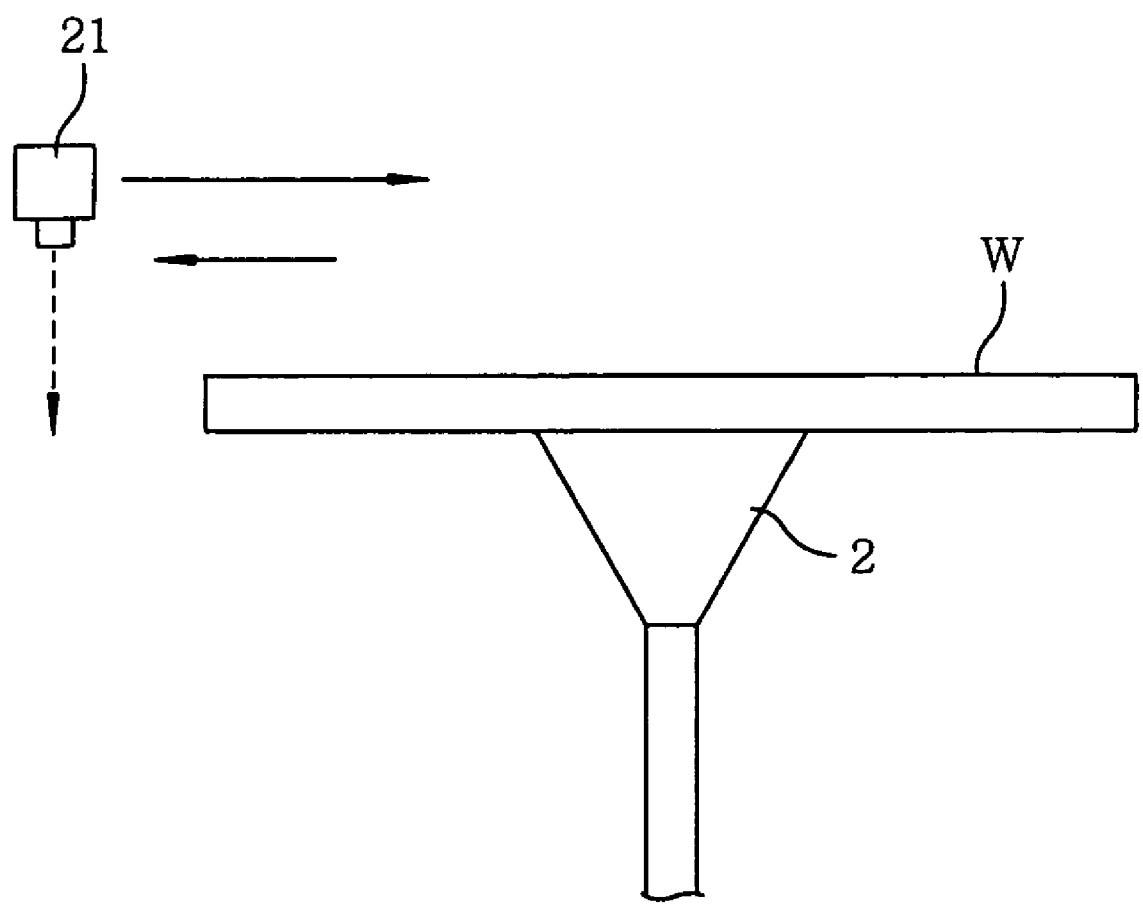
FIG. 16 explains a conventional teaching method.

In addition, the preferred embodiment of the present invention is not limited to a configuration in which the mark M of wafer W1 for use in aligning the position is formed at the center of the surface thereof. As illustrated in FIG. 14, for example, a plurality of marks M can be concentrically arranged about the center of the wafer W1. Such configuration can provide the same effects of the aforementioned case.

In addition, the present invention is not limited to a coating/developing device and, further, it can be applied to a substrate transfer mechanism incorporated in a device for forming a thin film such as an interlayer insulating film or a device protection layer. Further, the present invention can be applied to, e.g., an LCD substrate, a heating/cleaning apparatus of a reticle substrate for a photo mask and an LCD device without being limited to the wafer W1.

In accordance with the present invention, the substrate for use in aligning the position having a mark formed on a surface thereof is maintained on a substrate support member, and a center of a rotation axis is searched based on a locus of the mark, the locus being obtained by rotating the substrate about a vertical axis. Under such configuration, it is possible to check the amount of misalignment between the center of the substrate and that of the rotation axis and reduce such misalignment. Further, the centers thereof can be converged in a short period of time. Even in a case of the substrate support member not being rotated, a position alignment of the substrate transfer mechanism is carried out by checking the center of the substrate support member and that of the substrate by using a monitoring device, thereby enabling a more accurate position alignment. Further, under a configuration in which the monitoring device is supported by the substrate transfer mechanism and, at the same time, guided to a monitored location in a processing unit by the substrate transfer mechanism, time and effort put into the set up thereof can be reduced, so that the transfer position can be controlled in a short period of time.

While the invention has been shown and described with respect to the preferred embodiments, it will be understood by those skilled in the art that various changes and modifications may be made without departing from the spirit and scope of the invention as defined in the following claims.

What is claimed is:

1. A substrate processing apparatus including a processing unit for processing a substrate horizontally supported on a substrate support member rotatable about a vertical axis, wherein the apparatus has preacquired data of a substrate transfer position of a substrate transfer mechanism with respect to the substrate support member, the apparatus comprising:

a camera unit for photographing a mark formed on a surface of a position aligning substrate, placed on the substrate support member by the substrate transfer mechanism;

an operation unit for calculating an amount of misalignment between a center of the position aligning substrate and a center of rotation of the substrate support member by using position data of a center of locations of the mark photographed before and after rotating the substrate support member by an angle of 180 degrees, respectively;

a determination unit for judging whether or not the position aligning substrate is aligned with the substrate support member from the amount of misalignment;

an adjusting unit for repositioning the position aligning substrate by the substrate transfer mechanism to allow the center of the position aligning substrate to coincide with the center of rotation of the substrate support member if it is judged that the position aligning substrate is not aligned with the substrate support member; and a storage unit for storing position data of the substrate transfer mechanism when it is determined that the position aligning substrate is aligned with the center of the substrate support member.

2. The substrate processing apparatus of claim 1, wherein the mark is formed at a center of the surface of the position aligning substrate.

3. The substrate processing apparatus of claim 1, wherein the determination unit judges that the position aligning substrate is not aligned with the substrate support member if the amount of misalignment is greater than a threshold value preset for the processing unit, different threshold values being assigned for different kinds of processing units.

4. A substrate processing apparatus including a processing unit for processing a substrate horizontally supported on a substrate support member, wherein the apparatus has pre-acquired data of a substrate transfer position of a substrate transfer mechanism with respect to the substrate support member, the apparatus comprising:

a camera unit for photographing a mark formed at a center of a surface of a position aligning substrate placed on the substrate support member by the substrate transfer mechanism; and a determination unit for judging whether or not a center of the position aligning substrate coincides with a center of the substrate support member by using a photographed result of the mark obtained by the camera unit and a photographed result of a mark formed at the center of the substrate support member.

5. A substrate processing apparatus including a processing unit for processing a substrate horizontally supported on a substrate support member, wherein the apparatus has pre-acquired data of a substrate transfer position of a substrate transfer mechanism with respect to the substrate support member, the apparatus comprising:

a camera unit for photographing a mark formed at a center of a surface of a position aligning substrate placed on the substrate support member by the substrate transfer mechanism;

an operation unit for calculating an amount of misalignment between a center of the position aligning substrate and a center of the substrate support member by using a photographed result of the mark obtained by the camera unit and a photographed result of a mark formed at the center of the substrate support member monitored in advance;

a determination unit for judging whether or not the amount of misalignment is greater than a threshold value;

a adjusting unit for repositioning the position aligning substrate by the substrate transfer mechanism to allow the center of the position aligning substrate to coincide with the center of the substrate support member when it is determined that the amount of misalignment is greater than the threshold value; and a storage unit for storing position data of the substrate transfer mechanism when the amount of misalignment is not greater than the threshold value.

6. The substrate processing apparatus of claim 1, wherein the substrate transfer mechanism includes a plurality of transfer arms vertically arranged and to move back and forth independently, and the position aligning substrate and the camera unit are supported by different transfer arms among the plurality of the transfer arms, respectively.

7. A substrate processing apparatus including a processing unit for processing a substrate horizontally supported on a substrate support member rotatable about a vertical axis, wherein the apparatus has preacquired data of a substrate transfer position of a substrate transfer mechanism with respect to the substrate support member, the apparatus comprising:

a first transfer arm for placing a position aligning substrate on the substrate support member;

a camera unit for photographing a mark formed at a surface of the position aligning substrate placed on the substrate support member and a marking serving as a center position of the substrate support member;

a second transfer arm for supporting the camera unit, the first and the second transfer arm being different from each other;

a position data acquisition program for obtaining mark position coordinate data from a photographed result of the mark obtained by the camera unit before and after rotating the position aligning substrate by 180 degrees placed on the substrate support member and marking position coordinate data from a photographed result of the marking by the unit;

an operation unit for calculating an amount of misalignment by comparing the marking position coordinate data with center position coordinate data corresponding to a center of locations represented by the mark position coordinate data;

a determination program for judging whether or not the position alignment substrate is aligned with the substrate support member by using the amount of misalignment;

a re-execution program for repositioning the position aligning substrate by the first transfer arm to allow a center of the position aligning substrate to coincide with the center position of the substrate support member;

a storage unit for storing position data of the first transfer arm when it is determined that the position aligning substrate is aligned with the substrate support member.

8. The substrate processing apparatus of claim 7, wherein the determination program has a threshold value preset according to a kind of the processing unit, the threshold value being compared with the amount of misalignment to judge whether or not the position alignment substrate is aligned with the substrate support member by using the amount of misalignment.

9. The substrate processing apparatus of claim 7, wherein after determining a substrate transfer position of the first transfer arm, the position aligning substrate is transferred on the substrate support member by another transfer arm other than the first transfer arm, and the camera unit supported by a different transfer arm other than said another transfer arm to thereby acquiring data of a substrate transfer position of said another transfer arm.

10. The substrate processing apparatus of claim 9, wherein the camera unit on the different transfer arm is transferred to a transfer arm other than the different transfer arm via the substrate support member.

11. The substrate processing apparatus of claim 7, wherein the transfer arm supporting the camera unit is employed only for supporting the camera unit.

12. The substrate processing apparatus of claim 7, further comprising a substrate elevating member capable of elevating the position aligning substrate while supporting a backside thereof, wherein the position aligning substrate placed on the substrate support member is raised close to the camera unit by the substrate elevating member and then is photographed.

13. A substrate transfer position adjusting method for acquiring position data of a substrate transfer mechanism in transferring a substrate on a substrate support member rotatable about a vertical axis and installed to a processing unit for processing a substrate, comprising the steps of:

(a) transferring a position aligning substrate having a mark formed at a surface thereof on the substrate support member by the substrate transfer mechanism;

(b) photographing the mark by a camera unit before and after rotating the substrate support member by an angle of 180 degrees;

(c) calculating an amount of misalignment between a center of the substrate and a center of rotation of the substrate support member based on position data of a middle point of a straight line connecting positions of each mark obtained in the step of (b);

(d) judging whether or not the position aligning substrate is aligned with the substrate support member from the amount of misalignment;

(e) repositioning the position aligning substrate by the substrate transfer mechanism to allow the center of the position aligning substrate to coincide with the center of rotation of the substrate support member if it is judged that the position aligning substrate is not aligned with the substrate support member; and (f) acquiring position data of the substrate transfer mechanism when it is determined that the position aligning substrate is aligned with the substrate support member.

14. A substrate transfer position adjusting method for acquiring position data of a substrate transfer mechanism in transferring a substrate on a substrate support member installed to a processing unit for processing a substrate, comprising the steps of:
- (a) transferring a position aligning substrate having a mark formed at a center of a surface thereof on the substrate support member by the substrate transfer mechanism;
- (b) photographing the mark by a camera unit; and
- (c) judging whether or not the position aligning substrate is aligned with the substrate support member from a result of the photographing obtained in the step of (b).

15. A substrate transfer position adjusting method for acquiring position data of a substrate transfer mechanism in transferring a substrate on a substrate support member installed to a processing unit for processing a substrate, comprising the steps of:
- (a) transferring a position aligning substrate having a mark formed at a center of a surface thereof on the substrate support member by the substrate transfer mechanism;
- (b) photographing the mark by a camera unit;
- (c) calculating an amount of misalignment between the center of the substrate and a center of rotation of the substrate support member based on a result of the photographing obtained in the step of (b);
- (d) judging whether or not the amount of misalignment is greater than a threshold value;
- (e) repositioning the position aligning substrate by the substrate transfer mechanism to allow the center of the position aligning substrate to coincide with the center of the center of the substrate support member when it is determined that the amount of misalignment is greater than the threshold value; and
- (f) acquiring position data of the substrate transfer mechanism obtained when it is determined that the position aligning substrate is aligned with the center of the substrate support member.

16. The substrate transfer position adjusting method of claim 15, wherein the substrate transfer mechanism includes a plurality of transfer arms vertically arranged and to move back and forth independently, and wherein the step of photographing the mark further includes the steps of: transferring the position aligning substrate on the substrate support member by moving forth one transfer arm among the plurality of transfer arms; withdrawing said one transfer arm; and photographing the mark of the position aligning substrate by using the camera unit supported on another transfer arm by moving forward said another transfer arm among the plurality of transfer arms.

17. The substrate transfer position adjusting method of claim 16, further including the steps of:
- transferring the position aligning substrate on the substrate support member by another transfer arm after determining a substrate transfer position of one transfer arm; and
- acquiring position data of said another transfer arm by maintaining a camera unit on a transfer arm other than said another transfer arm.

18. The substrate transfer position adjusting method of claim 16, further including the steps of:
- mounting the camera unit maintained by said another transfer arm on the substrate support member; and
- transferring the camera unit mounted on the substrate support member on a transfer arm other than said another arm.

19. The substrate transfer position adjusting method of claim 16, wherein said another transfer arm supporting the camera unit is employed only for supporting the camera unit.

20. The substrate transfer position adjusting method of claim 15, wherein in the step of photographing the mark on the surface of the substrate, the photographing is carried out in such a way that the substrate is raised close to the camera unit by a substrate elevating member while supporting a backside of the substrate transferred on the substrate support member.

* * * * *